(12) United States Patent
Popoff

(10) Patent No.: US 7,606,098 B2
(45) Date of Patent: Oct. 20, 2009

(54) SEMICONDUCTOR MEMORY ARRAY ARCHITECTURE WITH GROUPED MEMORY CELLS, AND METHOD OF CONTROLLING SAME

(75) Inventor: Gregory Allan Popoff, Lausanne (CH)

(73) Assignee: Innovative Silicon ISi SA, Lausanne (CH)

( * ) Notice: Subject to any disclaimer, the term of this patent is extended or adjusted under 35 U.S.C. 154(b) by 306 days.

(21) Appl. No.: 11/787,718

(22) Filed: Apr. 17, 2007

(65) Prior Publication Data

US 2007/0241405 A1 Oct. 18, 2007

Related U.S. Application Data

(60) Provisional application No. 60/792,820, filed on Apr. 18, 2006.

(51) Int. Cl.
*G11C 7/02* (2006.01)
*G11C 7/00* (2006.01)

(52) U.S. Cl. .................. 365/210.14; 365/189.14; 365/189.15; 365/210.1; 365/210.13; 257/351

(58) Field of Classification Search ............ 365/189.14, 365/189.15, 210.1, 210.14, 210.13
See application file for complete search history.

(56) References Cited

U.S. PATENT DOCUMENTS 3,439,214 A 4/1969 Kabell 3,997,799 A 12/1976 Baker (Continued)

FOREIGN PATENT DOCUMENTS

EP 0 030 856 6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—Marcos D. Pizarro
*Assistant Examiner*—Raj Gupta
(74) *Attorney, Agent, or Firm*—Neil A. Steinberg

(57) ABSTRACT

An integrated circuit device (e.g., a logic device or a memory device) having a memory cell array including a plurality of word lines (e.g., first and second word lines) and a plurality of word line segments (e.g., first and second word line segments) wherein each word line segment is coupled to an associated word line (e.g., a first segment is associated with the first word line and a second segment is associated with the second word line). The memory cell array further includes a plurality of memory cells, wherein each memory cell includes a transistor having a first region, a second region, a body region, wherein the body region is electrically floating, and a gate coupled to an associated word line via an associated word line segment. A first group of memory cells is coupled to the first word line via the first word line segment and a second group of memory cells is coupled to the second word line via the second word line segment wherein at least one memory cell of the first group of memory cells is adjacent to at least one memory cell of the second group of memory cells.

28 Claims, 22 Drawing Sheets

U.S. PATENT DOCUMENTS

| | | |
|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,954,989 A | 9/1990 | Auberton-Herve et al. |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,310,809 B1 * | 10/2001 | Roohparvar et al. ........ 365/203 |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,434,079 B2 * | 8/2002 | Kim .................... 365/230.02 |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,714,436 B1 | 3/2004 | Burnett et al. |
| 6,721,222 B2 | 4/2004 | Somasekhar et al. |
| 6,861,689 B2 | 3/2005 | Burnett |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 7,030,436 B2 | 4/2006 | Forbes |
| 7,061,806 B2 | 6/2006 | Tang et al. |
| 7,085,156 B2 | 8/2006 | Ferrant et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2004/0227166 A1 * | 11/2004 | Portmann et al. ........... 257/222 |
| 2005/0001269 A1 | 1/2005 | Hayashi et al. |
| 2005/0017240 A1 | 1/2005 | Fazan |
| 2005/0062088 A1 | 3/2005 | Houston |
| 2005/0063224 A1 | 3/2005 | Fazan et al. |
| 2005/0064659 A1 | 3/2005 | Willer |

| | | |
|---|---|---|
| 2005/0105342 A1 | 5/2005 | Tang et al. |
| 2005/0111255 A1 | 5/2005 | Tang et al. |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0226070 A1 | 10/2005 | Ohsawa |
| 2005/0232043 A1 | 10/2005 | Ohsawa |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |
| 2007/0058427 A1 | 3/2007 | Okhonin et al. |
| 2007/0064489 A1 | 3/2007 | Bauser |
| 2007/0138530 A1 | 6/2007 | Okhonin |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 03171768 | 7/1991 |
| JP | 08213624 | 8/1996 |
| JP | 8-274277 | 10/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

"FBC (Floating Body Cell) for Embedded DRAM on SOI", Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI Flash Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"MOSFET Design Simplifies DRAM", P. Fazan, EE Times, May 14, 2002 (3 pages).

"One of Application of SOI Memory Cell—Memory Array", Lončar et al., IEEE Proc. 22$^{nd}$ International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15μ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"Design of a SOI Memory Cell", Stanojevic et al., IEEE Proc. 21st International Conference on Microelectronics (MIEL '97), vol. 1, NIS, Yugoslavia, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54$^{th}$ Annual Device Research Conference Digest (Cat. No. 96$^{TH}$8193), Jun. 1996, pp. 22-23.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Simulation of Floating Body Effect in SOI Circuits Using BSIM3SOI", Tu et al., Proceedings of Technical Papers (IEEE Cat No. 97$^{TH}$8303), Jun. 1997, pp. 339-342.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"SOI MOSFET Design for All-Dimensional Scaling with Short Channel, Narrow Width and Ultra-thin Films", Chan et al., IEEE IEDM, 1995, pp. 631-634.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Well nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floating-Body Charging in PD/SOI MOSFETs", Pelella et al., Final Camera Ready Art, SOI Conference, Oct. 1995, 2 pages.

"Floating-Body Concerns for SOI Dynamic Random Access Memory (DRAM)", Mandelman et al, Proceedings 1996 IEEE International SOI Conference, Oct. 1996, pp. 136-137.

* cited by examiner

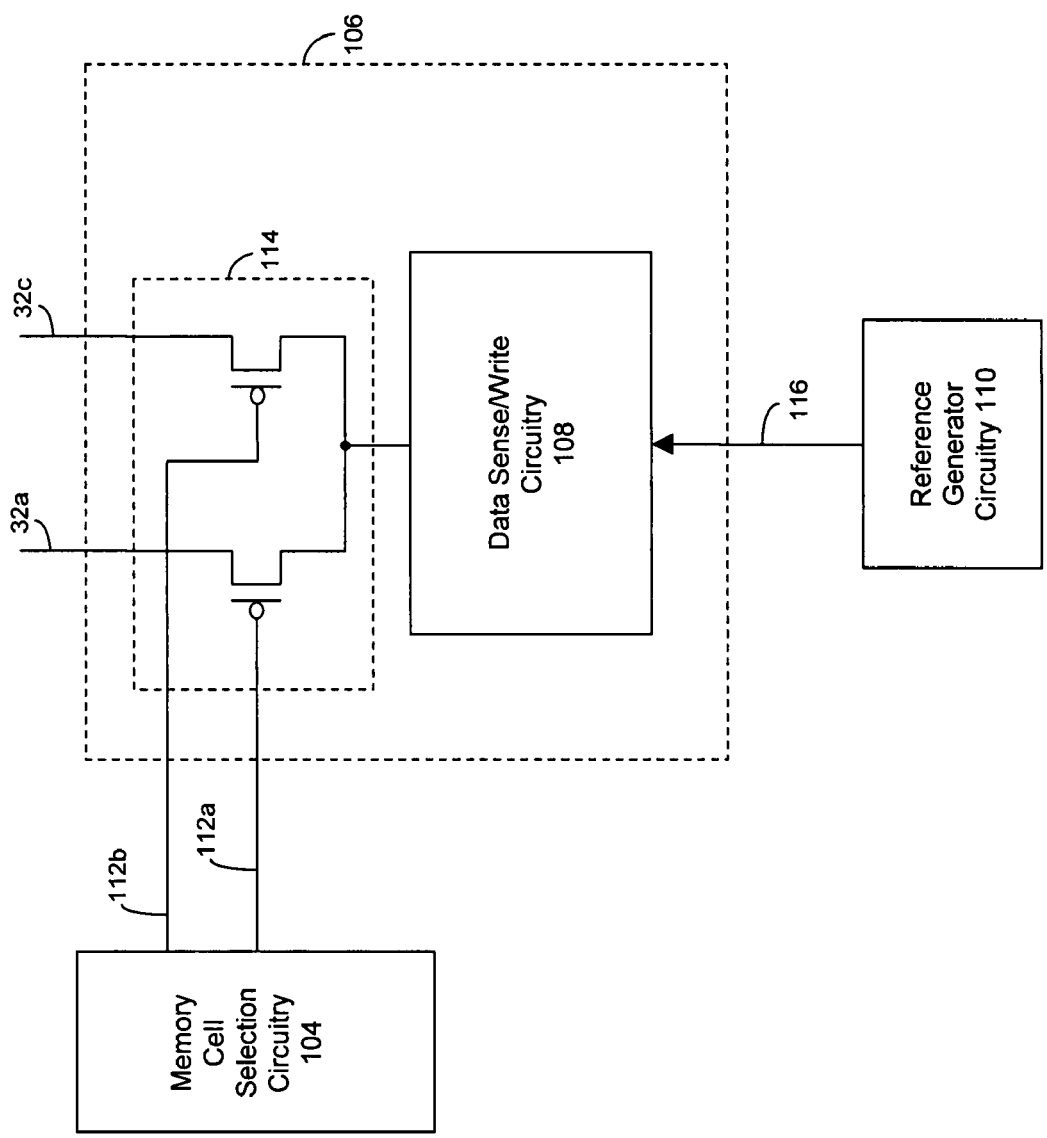

SEMICONDUCTOR MEMORY ARRAY ARCHITECTURE WITH GROUPED MEMORY CELLS, AND METHOD OF CONTROLLING SAME

RELATED APPLICATION

This application claims priority to U.S. Provisional Application Ser. No. 60/792,820, entitled "Semiconductor Memory Array Architecture, and Method of Controlling Same", filed Apr. 18, 2006; the contents of this provisional application are incorporated by reference herein in its entirety.

BACKGROUND

This invention relates to a semiconductor memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

There is a continuing trend to employ and/or fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), and Fin-FET. SOI devices have demonstrated improved performance (for example, speed), reduced leakage current characteristics and considerable enhancement in scaling.

One type of dynamic random access memory cell is based on, among other things, a floating body effect of SOI transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body of the transistor.

With reference to FIGS. 1A, 1B and 1C, in one embodiment, semiconductor DRAM array 10 includes a plurality of memory cells 12, each consisting of transistor 14 having gate 16, an electrically floating body region 18, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carries in the body region relative to an unprogrammed device and/or a device that is programmed with a logic low or State "0". In contrast, a logic low or State "0" corresponds to a reduced concentration of majority carries in the body region relative to an unprogrammed device and/or a device that is programmed with logic high or State "1".

Several arrangements, layouts and techniques have been proposed to read and write the data stored in an electrically floating body type transistor. For example, a current sense amplifier may be employed to compare the cell current to a reference current, for example, the current of a reference cell. From that comparison, it is determined whether the memory cell contained a logic high data state (relatively more majority carriers contained within body region) or logic low data state (relatively less majority carriers contained within body region). The differences of the charge stored in the body of the transistor affect the threshold voltage of the transistor, which in turn affects the current conducted by the transistor when switched into its conductive state.

In particular, with reference to FIG. 3, sense amplifier 36 (for example, a cross-coupled sense amplifier) typically includes an input/output 38a connected to an associated bit line and an input 38b connected to a reference current generator 40. In operation, sense amplifier 36 compares the current conducted by transistor 14 of memory cell 12 with a reference current generated by reference current generator 40. The magnitude of the reference current generally lies between the magnitudes of the currents conducted in the logic high data state and logic low data state of memory cell 12. The sense amplifier 36 compares the reference current to the current produced by memory cell 12 (the current varies depending on whether memory cell 12 is either in a logic high data state or logic low data state). Based on that comparison, sense amplifier 36 generates or outputs an output signal (on output 42) having a positive or negative polarity, depending upon whether memory cell 12 stored a logic high or logic low binary data state. (See, for example, U.S. Pat. No. 6,567,330; and "Memory Design Using a One-Transistor Cell on SOI", IEEE Journal of Solid-State Circuits, Vol. 37, No. 11, November 2002).

Conventional data sense circuitry/architectures and techniques of the prior art have a number of shortcomings. For example, the data sense circuitry/architecture and technique of the prior art requires a data sense circuit for each bit line. This results in a difficult pitch for implementing the sense amplifier design. (See, for example, U.S. Pat. Nos. 6,567,330 and 6,650,565). Such architectures often employ a pitch that is at least twice the pitch of the memory cell array. In addition, a large number of sense amplifiers are required if a large word line is employed to achieve dense memory arrays. This large number of sense amplifiers is generally not desirable since data from a subset of the number of cells is usually wanted/needed. This creates overhead in silicon area and power consumption.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device (for example, a logic or discrete memory device) having a memory cell array including (i) a plurality of word lines including a first word line and a second word line, (ii) a plurality of word line segments including a first word line segment and a second word line segment, wherein each word line segment is coupled to an associated word line and wherein the first word line segment is associated with the first word line and the second word line segment is associated with the second word line, (iii) a plurality of bit lines, and (iv) a plurality of memory cells. Each memory cell stores at least one data state and includes a transistor, wherein the transistor includes a first region coupled to an associated bit line, a second region, a body region disposed between the first region and the second region, and a gate disposed over the body region and coupled to an associated word line via an associated word line segment.

The memory cell array further includes a first group of memory cells which is coupled to the first word line via the first word line segment and a second group of memory cells is coupled to the second word line via the second word line segment. Moreover, at least one memory cell of the first group of memory cells is adjacent to at least one memory cell of the second group of memory cells.

The integrated circuit device of this principal aspect further includes first circuitry, coupled to (i) a first memory cell in the first group of memory cells and (ii) a first memory cell in the second group of memory cells, to sense the data state stored in the first memory cell and the second memory cell wherein the first memory cell in the second group of memory cells is adjacent to one of the memory cells in the first group of memory cells. In addition, the integrated circuit device includes reference generator circuitry, coupled to the first circuitry, to provide a reference to the first circuitry wherein the first circuitry uses the reference to sense the data state of each memory cell coupled to the first and second bit lines.

In one embodiment, the number of memory cells in the first group of memory cells is two. In another embodiment, the number of memory cells in the first group of memory cells is four. In yet another embodiment, the number of memory cells in the first group of memory cells is substantially equal to a pitch of the first circuitry.

The integrated circuit device may further include second circuitry, coupled to (i) a second memory cell in the first group of memory cells and (ii) a second memory cell in the second group of memory cells. In this embodiment, the first circuitry is located on a first side of the first and second groups of memory cells and the second circuitry is located on a second side of the first and second groups of memory cells, wherein the first side is opposite the second side.

The integrated circuit device may also include bit line selection circuitry (for example, a pass gate configuration (N-channel type, p-channel type or CMOS type)) which is disposed between (i) the first circuitry and (ii) the first and second bit lines, to connect the first bit line to the first circuitry in response to a first signal and the second bit line to the first circuitry in response to a second signal.

In another principal aspect, the present inventions are directed to an integrated circuit device (for example, a logic or discrete memory device) including a memory cell array having (i) a plurality of word lines including a first word line and a second word line, (ii) a plurality of word line segments including a first word line segment and a second word line segment, wherein each word line segment is coupled to an associated word line and wherein the first word line segment is associated with the first word line and the second word line segment is associated with the second word line, (iii) a plurality of bit lines, and (iv) a plurality of memory cells. Each memory cell stores at least one data state and includes a transistor, wherein the transistor includes a first region coupled to an associated bit line, a second region, a body region disposed between the first region and the second region, wherein the body region is electrically floating, and a gate disposed over the body region and coupled to an associated word line via an associated word line segment.

The memory cell array further includes a first group of memory cells which is coupled to the first word line via the first word line segment and a second group of memory cells is coupled to the second word line via the second word line segment. Moreover, at least one memory cell of the first group of memory cells is adjacent to at least one memory cell of the second group of memory cells.

The integrated circuit device of this aspect of the present inventions further includes first circuitry, coupled to a first bit line and a second bit line, to sense the data state of each memory cell coupled to the first and second bit lines, wherein: (i) the first region of the transistor of the first memory cell in the first group of memory cells is coupled to the first circuitry via the first bit line and (ii) the first region of the transistor of the first memory cell in the second group of memory cells is coupled to the first circuitry via the second bit line. Moreover, the integrated circuit device includes bit line selection circuitry (for example, a pass gate configuration (N-channel type, p-channel type or CMOS type)) to responsively connect the first bit line or second bit line to the first circuitry.

In one embodiment of this aspect of the invention, the integrated circuit device further includes reference generator circuitry, coupled to the first circuitry, to provide a reference to the first circuitry wherein the first circuitry uses the reference to sense the data state of each memory cell coupled to the first and second bit lines.

In one embodiment, the number of memory cells in the first group of memory cells is two or four, however, other numbers (whether odd or even) of memory cells are suitable (for example, 3, 5, 6, 7, 8, etc.). In one embodiment, the number of memory cells in the first group of memory cells is substantially equal to a pitch of the first circuitry.

The integrated circuit device, in one embodiment, may also include second circuitry, coupled to (i) a second memory cell in the first group of memory cells and (ii) a second memory cell in the second group of memory cells, wherein the first circuitry is located on a first side of the first and second groups of memory cells and the second circuitry is located on a second side of the first and second groups of memory cells, wherein the first side is opposite the second side.

In another principal aspect, the present inventions are directed to an integrated circuit device including a memory cell array having (i) a plurality of word lines including a first word line and a second word line, (ii) a plurality of word line segments including a first word line segment and a second word line segment, wherein each word line segment is coupled to an associated word line and wherein the first word line segment is associated with the first word line and the second word line segment is associated with the second word line, (iii) a plurality of bit lines, and (iv) a plurality of memory cells. Each memory cell stores at least one data state and includes a transistor, wherein the transistor includes a first region coupled to an associated bit line, a second region, a body region disposed between the first region and the second region, wherein the body region is electrically floating, and a gate disposed over the body region and coupled to an associated word line via an associated word line segment.

The memory cell array further includes a first group of memory cells which is coupled to the first word line via the first word line segment and a second group of memory cells is coupled to the second word line via the second word line segment. Moreover, at least one memory cell of the first group of memory cells is adjacent to at least one memory cell of the second group of memory cells.

The integrated circuit device of this aspect of the present inventions further includes first circuitry, coupled to a first memory cell in the first group of memory cells, to sense the data state stored in a first memory cell. In this principal aspect, the integrated circuit device includes bit line selection circuitry to responsively connect the first bit line or second bit line to the first circuitry.

In one embodiment, the integrated circuit device may include reference generator circuitry, coupled to the first circuitry, to provide a reference to the first circuitry wherein the first circuitry uses the reference to sense the data state of each memory cell coupled to the first and second bit lines.

In one embodiment, the number of memory cells in the first group of memory cells is two or four, however, other numbers (whether odd or even) of memory cells are suitable (for example, 3, 5, 6, 7, 8, etc.). In one embodiment, the number of memory cells in the first group of memory cells is substantially equal to a pitch of the first circuitry.

In yet another principal aspect, the present inventions are directed to an integrated circuit device (for example, a logic or discrete memory device) including a memory cell array having (i) a plurality of word lines including a first word line and a second word line, (ii) a plurality of word line segments including a first word line segment and a second word line segment, wherein each word line segment is coupled to an associated word line and wherein the first word line segment is associated with the first word line and the second word line segment is associated with the second word line, (iii) a plurality of bit lines, and (iv) a plurality of memory cells. Each memory cell includes a transistor, wherein the transistor includes a first region coupled to an associated bit line, a second region, a body region disposed between the first region and the second region, wherein the body region is electrically floating, and a gate disposed over the body region and coupled to an associated word line via an associated word line segment. Moreover, each memory cell includes (i) a first data state which is representative of a first charge in the body region of the electrically floating body transistor, and (ii) a second data state which is representative of a second charge in the body region of the electrically floating body transistor.

The memory cell array further includes a first group of memory cells which is coupled to the first word line via the first word line segment and a second group of memory cells is coupled to the second word line via the second word line segment. Moreover, at least one memory cell of the first group of memory cells is adjacent to at least one memory cell of the second group of memory cells.

In one embodiment, the integrated circuit device further includes (i) first circuitry, coupled to a first memory cell in the first group of memory cells, to sense the data state stored in a first memory cell, and (ii) second circuitry, coupled to a second memory cell in the first group of memory cells, to sense the data state stored in a second memory cell. In this embodiment, the number of memory cells in the first group of memory cells is substantially equal to a pitch of the first or second circuitry.

In another embodiment, the integrated circuit device further (i) first circuitry, coupled to a first memory cell in the first group of memory cells, to sense the data state stored in a first memory cell, and (ii) second circuitry, coupled to a second memory cell in the first group of memory cells, to sense the data state stored in a second memory cell. In this embodiment, the first circuitry is coupled to a first memory cell in the second group of memory cells, to sense the data state stored in a first memory cell in the second group of memory cells, and the second circuitry is coupled to a second memory cell in the second group of memory cells, to sense the data state stored in a second memory cell in the second group of memory cells. In addition, the first circuitry is located on a first side of the first and second groups of memory cells and the second circuitry is located on a second side of the first and second groups of memory cells, wherein the first side is opposite the second side.

In yet another embodiment, the integrated circuit device includes first circuitry, coupled to (i) a first memory cell in the first group of memory cells and (ii) a first memory cell in the second group of memory cells, to sense the data state stored in the first memory cell and the second memory cell wherein the first memory cell in the second group of memory cells is adjacent to one of the memory cells in the first group of memory cells. Indeed, in another embodiment, the integrated circuit device includes first circuitry, coupled to a first bit line and a second bit line, to sense the data state of each memory cell connected to the first and second bit lines, wherein (i) the first region of the transistor of the first memory cell in the first group of memory cells is coupled to the first circuitry via the first bit line, and (ii) the first region of the transistor of the first memory cell in the second group of memory cells is coupled to the first circuitry via the second bit line. The integrated circuit device may include bit line selection circuitry to responsively connect the first bit line or second bit line to the first circuitry. Indeed, the bit line selection circuitry may be disposed between (i) the first circuitry and (ii) the first and second bit lines, to connect the first bit line to the first circuitry in response to a first signal and the second bit line to the first circuitry in response to a second signal.

In one embodiment, the number of memory cells in the first group of memory cells is two or four, however, other numbers (whether odd or even) of memory cells are suitable (for example, 3, 5, 6, 7, 8, etc.). In one embodiment, the number of memory cells in the first group of memory cells is substantially equal to a pitch of the first circuitry.

In another principal aspect, the present inventions are directed to an integrated circuit device including a memory cell array having (i) a plurality of word lines including a first word line and a second word line, (ii) a plurality of word line segments including a first word line segment and a second word line segment, wherein each word line segment is coupled to an associated word line and wherein the first word line segment is associated with the first word line and the second word line segment is associated with the second word line, (iii) a plurality of bit lines, and (iv) a plurality of memory cells. Each memory cell stores at least one data state and consisting essentially of a transistor, wherein the transistor includes a first region coupled to an associated bit line, a second region, a body region disposed between the first region and the second region, wherein the body region is electrically floating, and a gate disposed over the body region and coupled to an associated word line via an associated word line segment.

The memory cell array further includes a first group of memory cells which is coupled to the first word line via the first word line segment and a second group of memory cells is coupled to the second word line via the second word line segment. Moreover, at least one memory cell of the first group of memory cells is adjacent to at least one memory cell of the second group of memory cells.

The integrated circuit device of this aspect of the present invention may further include first circuitry, coupled to a first memory cell in the first group of memory cells, to sense the data state stored in a first memory cell, wherein the number of memory cells in the first group of memory cells is substantially equal to a pitch of the first circuitry.

In one embodiment, the integrated circuit device further includes (i) first circuitry, coupled to a first memory cell in the first group of memory cells, to sense the data state stored in a first memory cell and (ii) second circuitry, coupled to a second memory cell in the first group of memory cells, to sense the data state stored in a second memory cell. The first circuitry is coupled to a first memory cell in the second group of memory cells, to sense the data state stored in a first memory cell in the second group of memory cells. The second circuitry is coupled to a second memory cell in the second group of memory cells, to sense the data state stored in a second memory cell in the second group of memory cells. In addition, the first circuitry is located on a first side of the first and second groups of memory cells and the second circuitry is located on a second side of the first and second groups of memory cells, wherein the first side is opposite the second side.

In another embodiment, the integrated circuit device further includes first circuitry, coupled to (i) a first memory cell in the first group of memory cells and (ii) a first memory cell in the second group of memory cells, to sense the data state stored in the first memory cell and the second memory cell. The first memory cell in the second group of memory cells of this embodiment is adjacent to one of the memory cells in the first group of memory cells. Indeed, the integrated circuit device of this embodiment may include reference generator circuitry, coupled to the first circuitry, to provide a reference to the first circuitry wherein the first circuitry uses the reference to sense the data state of each memory cell coupled to the first and second bit lines.

In one embodiment, the integrated circuit device may include first circuitry, coupled to a first bit line and a second bit line, to sense the data state of each memory cell connected to the first and second bit lines, wherein (i) the first region of the transistor of the first memory cell in the first group of memory cells is coupled to the first circuitry via the first bit line, and (ii) the first region of the transistor of the first memory cell in the second group of memory cells is coupled to the first circuitry via the second bit line. The integrated circuit device may also bit line selection circuitry disposed between (i) the first circuitry and (ii) the first and second bit lines, to connect the first bit line to the first circuitry in response to a first signal and the second bit line to the first circuitry in response to a second signal. Notably, in this embodiment, the integrated circuit device may include reference generator circuitry, coupled to the first circuitry, to provide a reference to the first circuitry wherein the first circuitry uses the reference to sense the data state of each memory cell coupled to the first and second bit lines.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions). For example, the present inventions may be implemented in conjunction with memory cells which implement any memory cell technology that generates at least two current or voltage values (each current or voltage being representative of, for example, a respective data state) and employs a reference to discriminate such data states. For example, the memory cells may be comprised of electrically floating gate transistors, junction field effect transistors (often referred to as JFETs), or any other memory/transistor technology whether now known or later developed. All such memory technologies are considered to fall within the scope of the present inventions.

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 5 is a schematic block diagram illustration of an embodiment of the bit line selection circuit, in conjunction with data sense/write circuitry, and certain peripheral circuitry (i.e., reference generator circuitry and memory cell selection circuitry), according to certain aspects of the present inventions;

DETAILED DESCRIPTION

There are many inventions described and illustrated herein. In one aspect, the present inventions are directed to an architecture, a configuration or a layout of a semiconductor memory cell array having a plurality of memory cells, arranged in a plurality of rows, and data sense and write circuitry to write data into and/or read data from such memory cells. The memory cell array may comprise a portion of an integrated circuit device, for example, a logic device (such as, a microcontroller or microprocessor) or a memory device (such as, a discrete memory). In one embodiment, of this aspect of the present inventions, each memory cell includes at least one electrically floating body transistor.

In another aspect, the present inventions are directed to methods to control, read and/or write data into one or more memory cells of the memory cell array. In this regard, in one embodiment, an integrated circuit device may include data sense and write circuitry and certain peripheral circuitry to implement control, refresh, hold, read and/or write operations relative to a memory cell array having a plurality of memory cells. In one embodiment of this aspect of the present inventions, each memory cell includes at least one electrically floating body transistor.

Figure 1A:
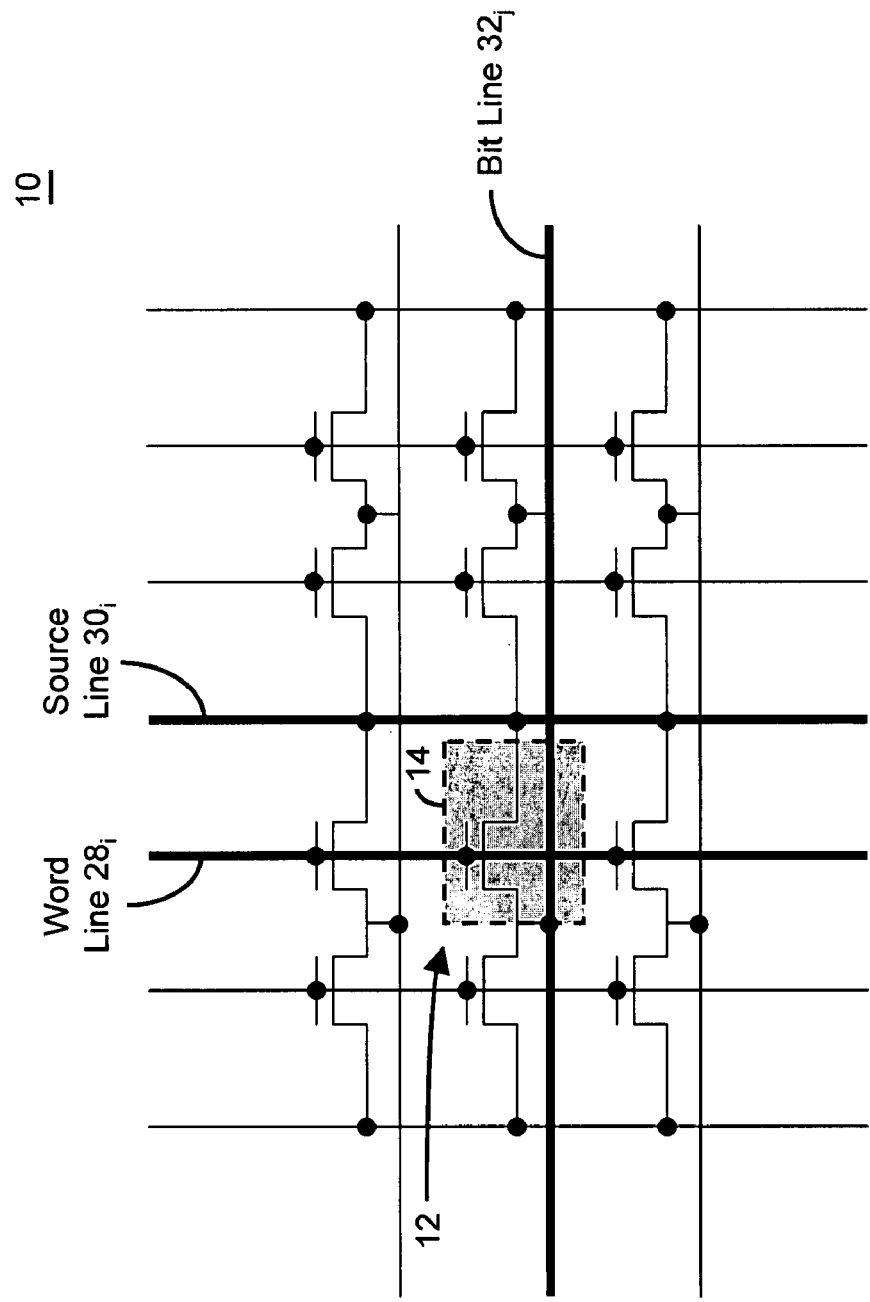
FIG. 1A is a schematic representation of a prior art DRAM array including a plurality of memory cells comprised of one electrically floating body transistor.
Figure 1B:
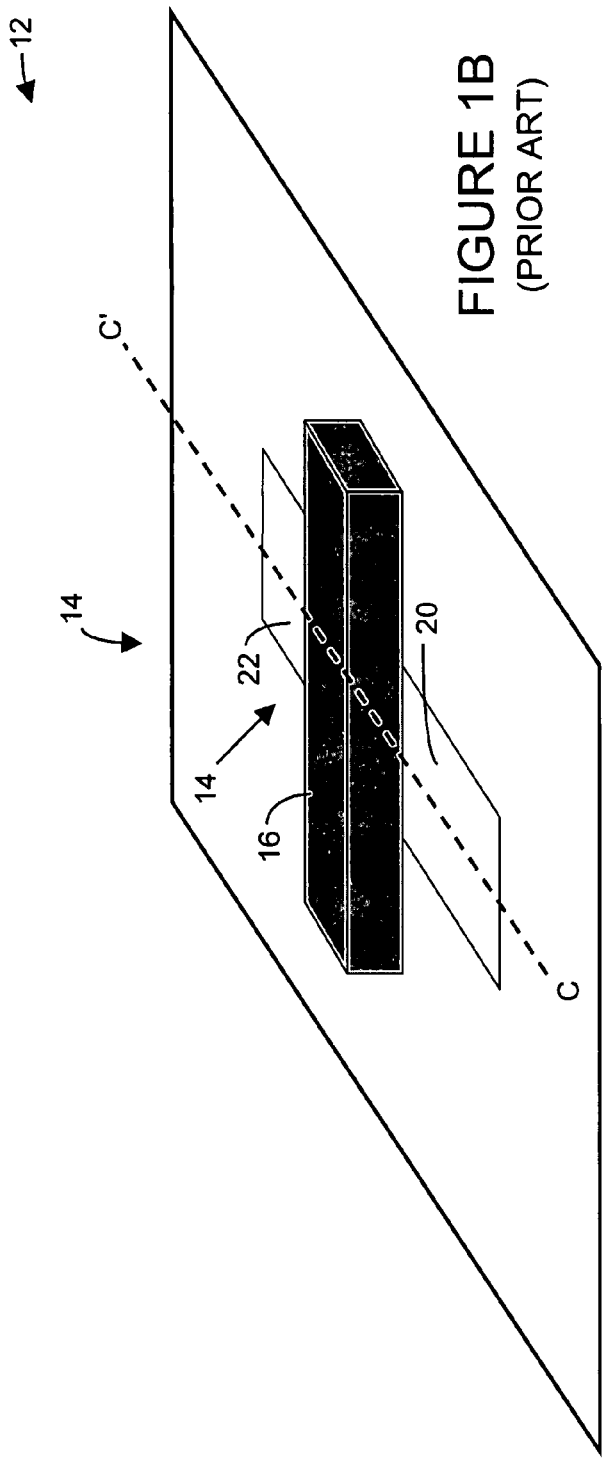
FIG. 1B is a three dimensional view of an exemplary prior art memory cell comprised of one electrically floating body transistor (PD-SOI NMOS)
Figure 1C:
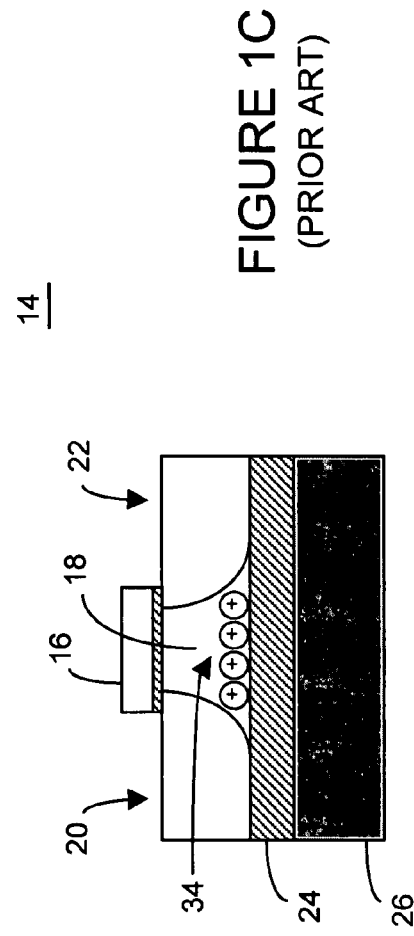
FIG. 1C is a cross-sectional view of the prior art memory cell of FIG. 1B, cross-sectioned along line C-C'.
Figure 2A:
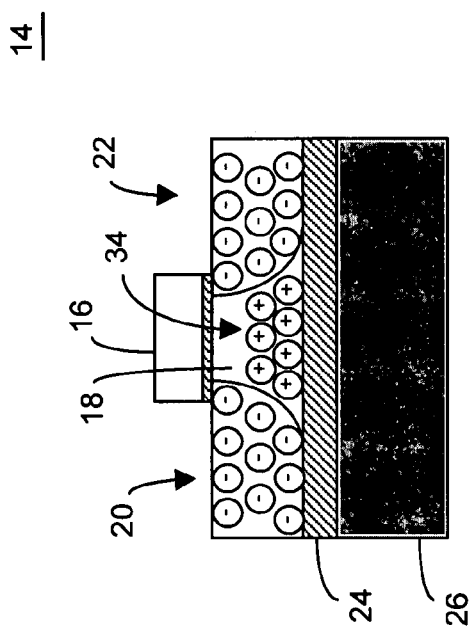
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
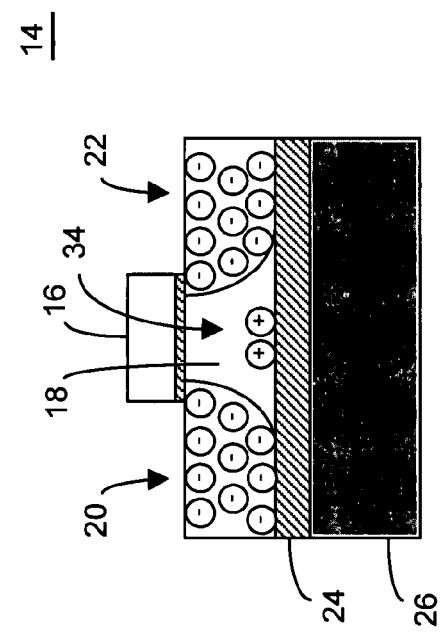
Figure 3:
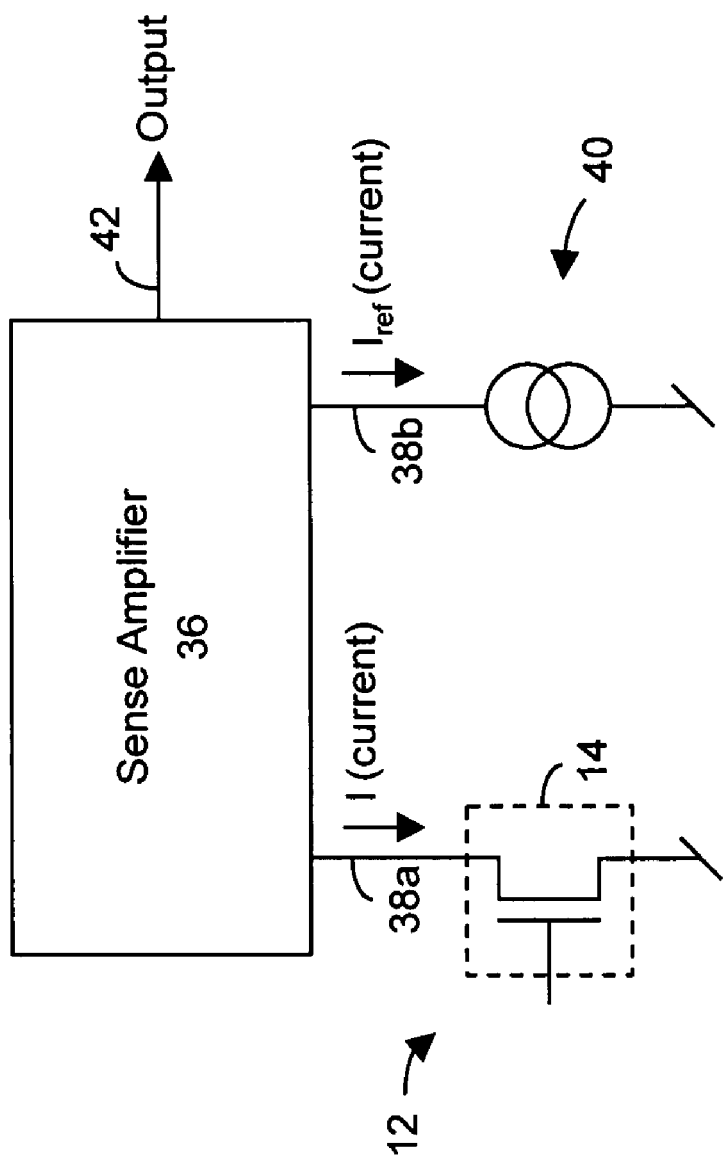
FIG. 3 is a block-diagram illustration of a conventional circuit configuration to read data from a memory cell.
Figure 4A:
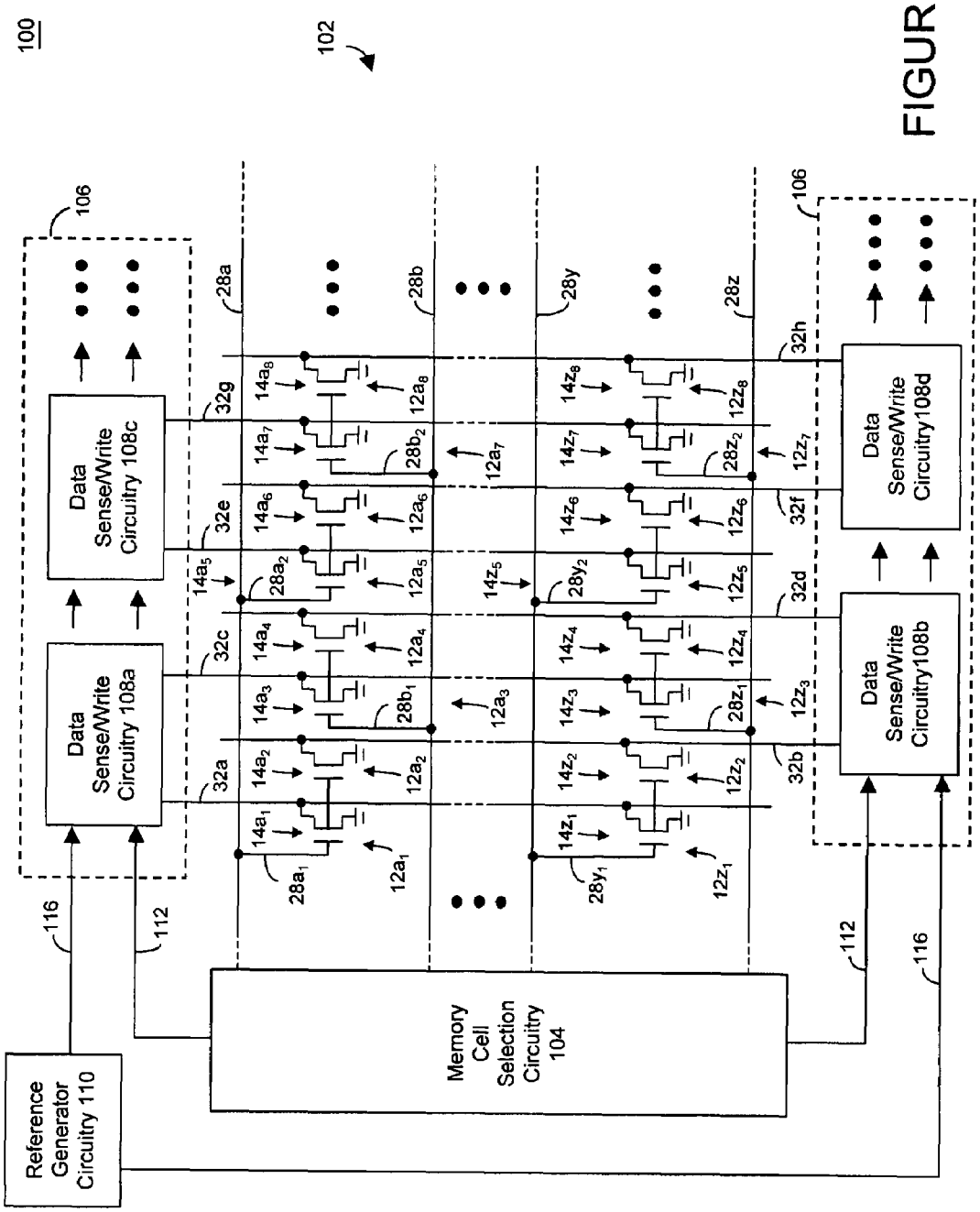
FIGS. 4A and 4B are schematic block diagram illustrations of two embodiments of the architecture of a portion of a memory cell array and associated data sense/write circuitry, in conjunction with certain peripheral circuitry (i.e., reference generator circuitry and memory cell selection circuitry), according to certain aspects of the present inventions.

With reference to FIG. 4A, integrated circuit device 100, according to one embodiment of the present inventions, includes memory cell array 102 having a plurality of memory cells 12, each including an electrically floating body transistor 14. The memory cells 12 are connected to word lines 28 (via the gate of transistor 14) and bit lines 32 (via the drain of transistor 14). In this embodiment, two adjacent memory cells 12 are interconnected to an associated word line 28 via an associated word line segment. For example, the gates of adjacent transistors $14a_1$ and $14a_2$ of adjacent memory cells $12a_1$ and $12a_2$, respectively, are connected to an associated word line $28a$ via word line segment $28a_1$. Similarly, the gates of adjacent transistors $14a_3$ and $14a_4$ of adjacent memory cells $12a_3$ and $12a_4$, respectively, are connected to an associated word line $28b$ via word line segment $28b_1$. Likewise, the gates of adjacent transistors $14z_1$ and $14z_2$ of adjacent memory cells $12z_1$ and $12z_2$, respectively, are connected to an associated word line $28y$ via a word line segment $28y_1$; and the gates of adjacent transistors $14z_3$ and $14z_4$ of adjacent memory cells $12z_3$ and $12z_4$, respectively, are connected to an associated word line $28z$ via a word line segment $28z_1$. Notably, where the memory cell array is comprised, at least in part from a silicon material (for example, monocrystalline or polycrystalline silicon, whether doped or undoped), the word line segments (and the gates interconnected thereby) may be formed from a polysilicon material.

In addition, in this embodiment, the drain regions of the adjacent transistors 14 of the adjacent memory cells 12 are connected to adjacent bit lines 32. For example, the drain regions of adjacent transistors $14a_1$ and $14a_2$ of adjacent memory cells $12a_1$ and $12a_2$, respectively, are connected to bit line 32a and 32b, respectively. Similarly, the drain regions of adjacent transistors $14a_3$ and $14a_4$ of adjacent memory cells $12a_3$ and $12a_4$, respectively, are connected to bit lines 32c and 32d, respectively. Moreover, the drain regions of adjacent transistors $14z_1$ and $14z_2$ of adjacent memory cells $12z_1$ and $12z_2$, respectively, are connected to bit lines 32a and 32b, respectively. Further, the drain regions of adjacent transistors $14z_3$ and $14z_4$ of adjacent memory cells $12z_3$ and $12z_4$, respectively, are connected to bit lines 32c and 32d, respectively.

The integrated circuit device 100 further includes memory cell selection circuitry 104 and reading and programming circuitry 106. Briefly, memory cell selection circuitry 104 selects or enables one or more memory cells 12 to facilitate reading data therefrom and/or writing data thereto by applying a control signal on one or more word line 28. Notably, memory cell selection circuitry 104 may be a conventional word line decoder and/or driver. There are many different control/selection techniques (and circuitry therefor) to implement the memory cell selection technique. Such techniques, and circuitry therefor, are well known to those skilled in the art. Notably, all such control/selection techniques, and circuitry therefor, whether now known or later developed, are intended to fall within the scope of the present inventions.

With continued reference to FIG. 4A, reading and programming circuitry 106 reads data from and writes data to selected memory cells 12. In one embodiment, the reading and programming circuitry 106 include data sense/write circuitry 108a-x. The data sense/write circuitry 108a-x are coupled to receive an output of reference generator circuitry 110 (for example, a current or voltage reference) and are coupled to a plurality of associated bit lines 32. For example, data sense/write circuitry 108a couples to bit lines 32a and 32c, and data sense/write circuitry 108b couples to bit lines 32b and 32d. Similarly, data sense/write circuitry 108c couples to bit lines 32e and 32g, and data sense/write circuitry 108d couples to bit lines 32f and 32h.

In one embodiment, data sense/write circuitry 108 includes a data sense amplifier (for example, a cross-coupled sense amplifier as described and illustrated in the Non-Provisional U.S. patent application Ser. No. 11/299,590 (U.S. Patent Application Publication US 2006/0126374), filed by Waller and Carman, on Dec. 12, 2005 and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12. The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained a logic high (relatively more majority carries 34 contained within body region 18) or logic low data state (relatively less majority carries 28 contained within body region 18).

As mentioned above, data sense/write circuitry 108 is coupled to two bit lines. In a read operation, one of the bit lines (i.e., the active bit line) is selectively connected to the data sense and/or write circuitry in order to sense the data state in a memory cell and/or write a data state into a memory cell which is associated with the selected bit line. For example, with reference to FIG. 4A, during a read operation, one of the bit lines 32a and 32c is connected to the sense circuitry in data sense/write circuitry 108a. In one embodiment, the active bit line is selected by memory selection circuitry 104 using, for example, one or more bits of the row address (for example, the MSB or LSB). Notably, the other bit line is disconnected from the sensing circuitry of data sense/write circuitry 108.

With reference to FIG. 5, in one embodiment, reading and programming circuitry 106 includes bit line selection circuit 114 to select one of the bit lines connected to data sense/write circuitry 108. For example, with reference to FIG. 5, in one embodiment, bit line selection circuit 114 may include two P-channel type transistors that receive either the control signal on signal line 112a (from memory selection circuitry 104) or the control signal on signal line 112b. In response, one of two associated bit lines 32 (for example, bit lines 32a or 32c, or bit lines 32b or 32d) is connected to the appropriate circuitry in data sense/write circuitry 108. Notably, any bit line selection circuit whether now known or later developed is intended to fall within the scope of the present inventions.

With continued reference to FIG. 4A, integrated circuit device 100 also includes reference generator circuitry 110. As mentioned above, reference generator circuitry 110 generates a reference (for example, a voltage and/or current reference) which is provided to reading and programming circuitry 106 via signal line 116. The reading and programming circuitry 106, and, in particular, data sense/write circuitry 108 employs the reference to determine the data state of the selected memory cell 12 during, for example, a read operation.

With continued reference to FIG. 4A, in read operation, memory cell selection circuitry 104, in response to an address signal designating for example, a memory cell 12 connected to word line 28b, applies a control signal on word line 28b (and correspondingly word line segment $28b_1$ among other word line segments connected to word line 28b including word line segment $28b_2$). In addition, memory cell selection circuitry 104 applies a control signal on signal lines 112 which connects bit line 32c to the data sensing circuitry in data sense/write circuitry 108a, bit line 32d to the data sensing circuitry in data sense/write circuitry 108b, bit line 32g to the data sensing circuitry in data sense/write circuitry 108c, and bit line 32h to the data sensing circuitry in data sense/write circuitry 108d. In response, the data sensing circuitry (for example, a cross-coupled sense amplifier) in data sense/write circuitry 108a, 108b, 108c and 108d sample, sense, read and/or determine the data state stored in memory cells $12a_3$, $12a_4$, $12a_7$, and $12a_8$, respectively. As mentioned above, in one embodiment, the data sensing circuitry in data sense/write circuitry 108 compares a signal from the selected memory cells 12 (in this example, memory cells $12a_3$, $12a_4$, $12a_7$, and $12a_8$) to one or more references from reference generator circuitry 110 to determine the data state stored in the selected memory cells 12.

Similarly, in a write operation, where an address signal designates memory cells 12 connected to word line 28b (and correspondingly word line segment $28b_1$ among other word line segments connected to word line 28b including word line segment $28b_2$), for example, memory cells $12a_3$, $12a_4$, $12a_7$, and $12a_8$, memory cell selection circuitry 104 applies a control signal on word line 28b as well as a control signal on signal lines 112 which connects bit line 32c to the data writing circuitry in data sense/write circuitry 108a, bit line 32d to the data writing circuitry in data sense/write circuitry 108b, bit line 32g to the data writing circuitry in data sense/write circuitry 108c, and bit line 32h to the data writing circuitry in data sense/write circuitry 108d. Under this condition, memory cells $12a_3$, $12a_4$, $12a_7$, and $12a_8$ are connected to the data writing circuitry of data sense/write circuitry 108a, 108b, 108c, and 108d, respectively. In response, the data writing circuitry in data sense/write circuitry 108a, 108b, 108c and 108d writes and/or programs a data state in memory cells $12a_3$, $12a_4$, $12a_7$, and $12a_8$, respectively.

Notably, where an address designates memory cells 12 connected to word line 28a (and corresponding word line segment $28a_1$ among other word line segments connected to word line 28a including word line segment $28a_2$), for example, memory cells $12a_1$, $12a_2$, $12a_5$, and $12a_6$, memory cell selection circuitry 104 applies a control signal on signal lines 112 which connects bit line 32a to the data sensing circuitry in data sense/write circuitry 108a, bit line 32b to the data sensing circuitry in data sense/write circuitry 108b, bit line 32e to the data sensing circuitry in data sense/write circuitry 108c, and bit line 32f to the data sensing circuitry in data sense/write circuitry 108d. The data sensing circuitry and/or data writing circuitry in data sense/write circuitry 108a, 108b, 108c and 108d performs the appropriate operation (for example, read operation) with respect to memory cells $12a_1$, $12a_2$, $12a_5$, and $12a_6$, respectively.

Figure 6A:
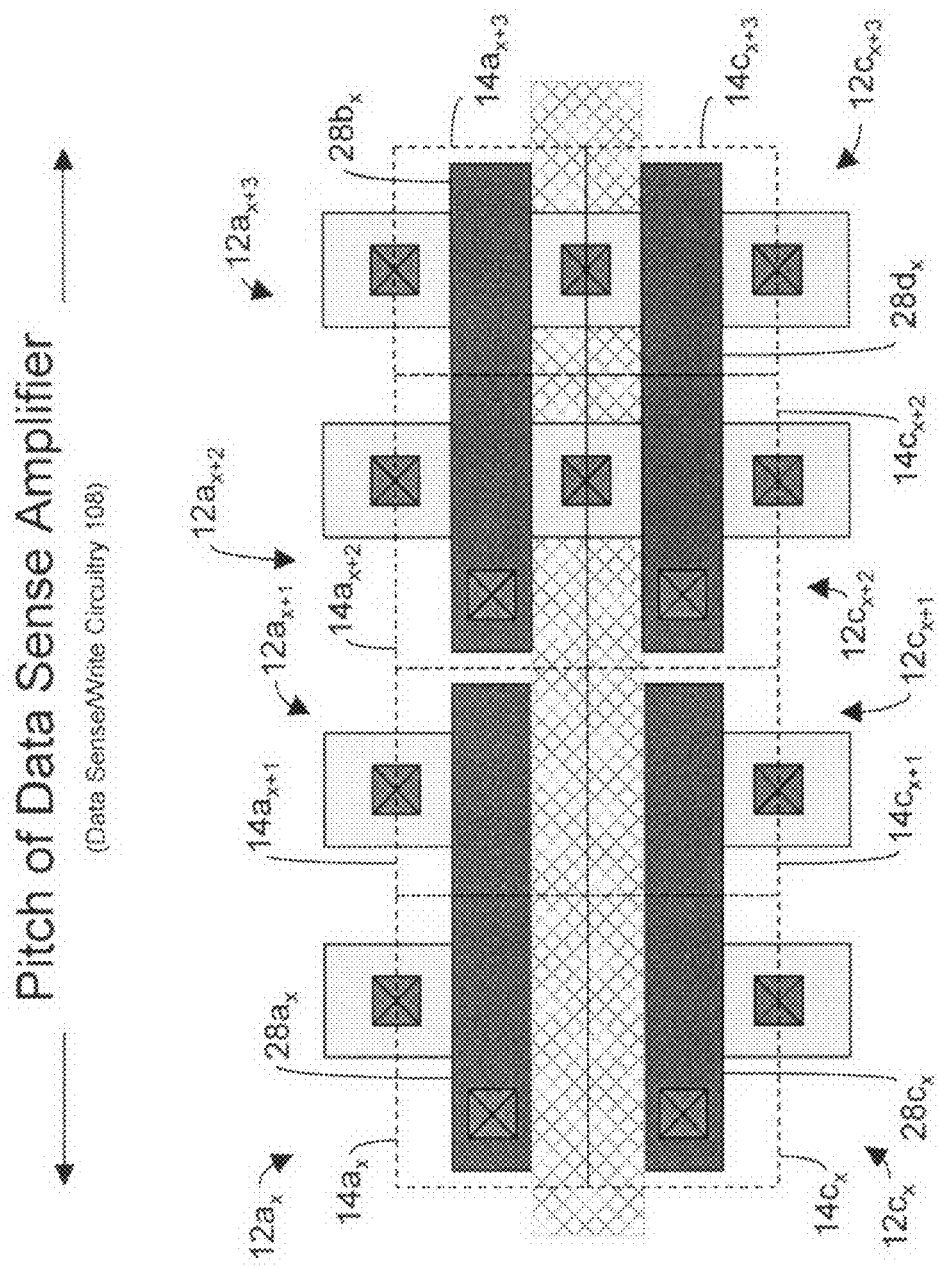
FIG. 6A is a plan view layout of a portion of the memory cell array of FIG. 4A illustrating word line segments of two memory cells which share a gate (for example, a gate comprised of polysilicon), according to certain aspects of the present inventions.
Figure 6B:
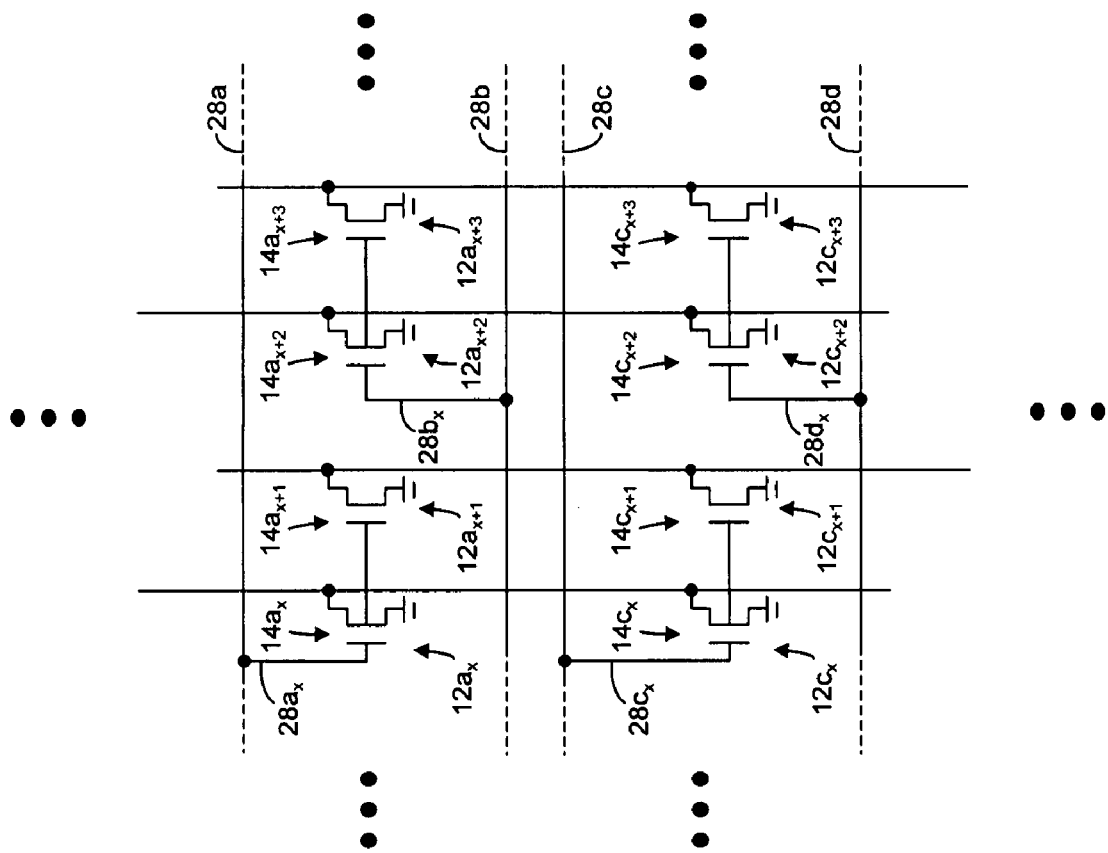
FIG. 6B is schematic block diagram illustration of a portion of a memory cell array which corresponds to the layout of FIG. 6A, according to certain aspects of the present inventions.

With reference to FIGS. 6A and 6B, in one embodiment, the present inventions may include memory cells 12 having electrically floating body transistor 14, as described above. In this exemplary layout, electrically floating body transistor 14 is an N-channel type transistor. In addition, the word line segments 28 interconnect and form the gates of adjacent transistors of adjacent memory cells. For example, word line segment $28a_x$ forms the gate of transistor $14a_x$ (of memory cell $12a_x$) and $14a_{x+1}$ (of memory cell $12a_{x+1}$). Similarly, word line segment $28b_x$ forms the gate of transistor $14a_{x+2}$ (of memory cell $12a_{x+2}$) and $14a_{x+3}$ (of memory cell $12a_{x+3}$). Further, word line segment $28c_x$ forms the gate of transistor $14c_x$ (of memory cell $12c_x$) and $14c_{x+1}$ (of memory cell $12c_{x+1}$). In addition, word line segment $28c_{x+2}$ forms the gate of transistor $14c_{x+2}$ (of memory cell $12c_x$) and $14c_{x+3}$ (of memory cell $12c_{x+3}$). Notably, in a preferred embodiment, the configuration and/or layout of the memory cells 12 is proportional and/or equal to the pitch of the data sensing circuitry (for example, a data sense amplifier) in data sense/write circuitry 108.

In another embodiment, the word line segments are employed to interconnect more than two adjacent transistors of adjacent memory cells. For example, with reference FIG. 4B, word line segment $28a_1$ interconnects gates of transistors $14a_1$, $14a_2$, $14a_3$, and $14a_4$ of memory cells $12a_1$, $12a_2$, $12a_3$, and $12a_4$, respectively. Similarly, word line segment $28b_1$ interconnects gates of transistors $14a_5$, $14a_6$, $14a_7$, and $14a_8$ of memory cells $12a_5$, $12a_6$, $12a_7$, and $12a_8$, respectively. Further, word line segment $28y_1$ interconnects gates of transistors $14z_1$, $14z_2$, $14z_3$, and $14z_4$ of memory cells $12z_1$, $12z_2$, $12z_3$, and $12z_4$, respectively; and word line segment $28z_1$ interconnects gates of transistors $14z_5$, $14z_6$, $14z_7$, and $14z_8$ of memory cells $12z_5$, $12z_6$, $12z_7$, and $12z_8$, respectively.

Notably, in this exemplary embodiment, the configuration and/or layout of the memory cells 12 is proportional and/or equal to the pitch of the data sensing circuitry (for example, a data sense amplifier) in data sense/write circuitry 108. As such, bit lines 32c and 32d are routed "outside" the pitch of the data sensing circuitry to connect, for example, memory cell $12a_3$ and $12a_4$ to the data sensing circuitry of data sense/write circuitry 108c and 108d, respectively.

In this way, where an operation to be performed on memory cells designated by an address signal for the memory cells 12 connected to word line 28a (and corresponding word line segment $28a_1$ among other word line segments connected to word line 28a), memory cell selection circuitry 104 applies a control signal on signal lines 112 which connects bit line 32a to the data sensing circuitry in data sense/write circuitry 108a, bit line 32b to the data sensing circuitry in data sense/write circuitry 108b, bit line 32c to the data sensing circuitry in data sense/write circuitry 108c, and bit line 32d to the data sensing circuitry in data sense/write circuitry 108d. The data sensing circuitry and/or data writing circuitry in data sense/write circuitry 108a, 108b, 108c and 108d performs the appropriate operation (for example, read or write operation) with respect to memory cells $12a_1$, $12a_2$, $12a_3$, and $12a_4$, respectively.

Figure 7A:
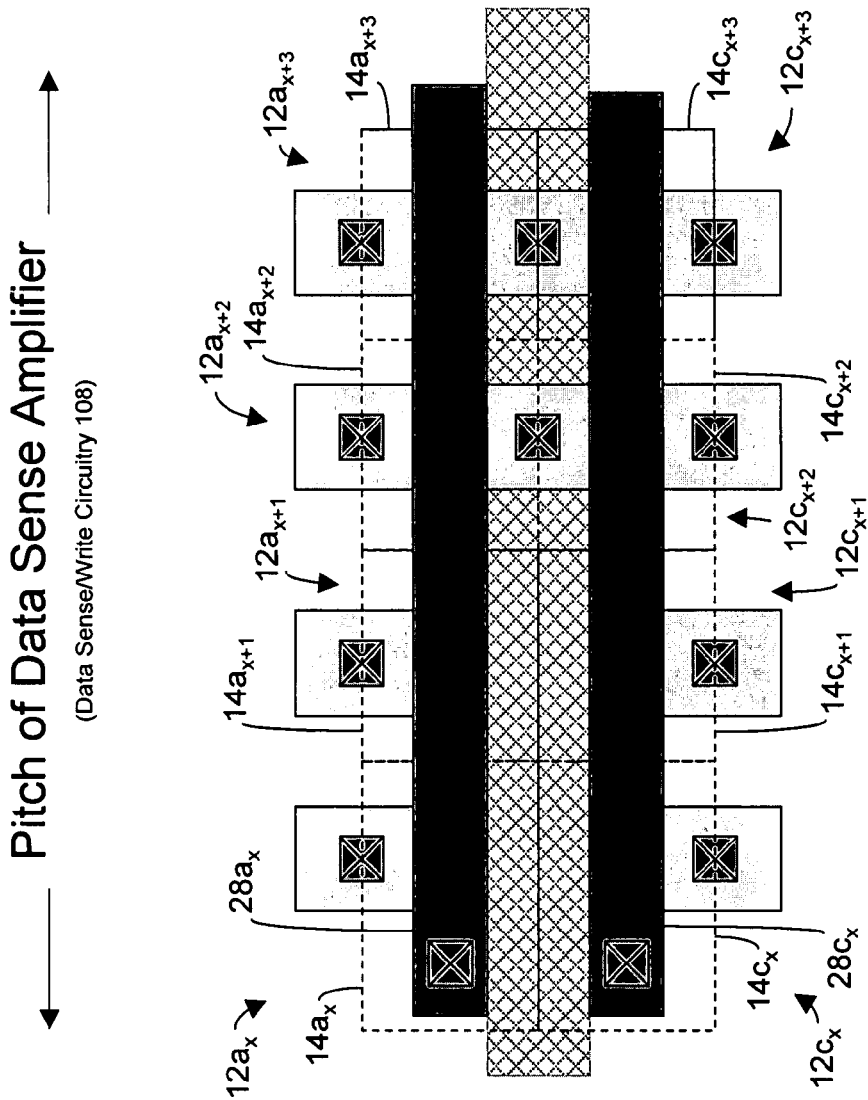
FIG. 7A is a plan view layout of a portion of the memory cell array of FIG. 4B illustrating word line segments of four memory cells which share a gate (for example, a gate comprised of polysilicon), according to certain aspects of the present inventions.
Figure 7B:
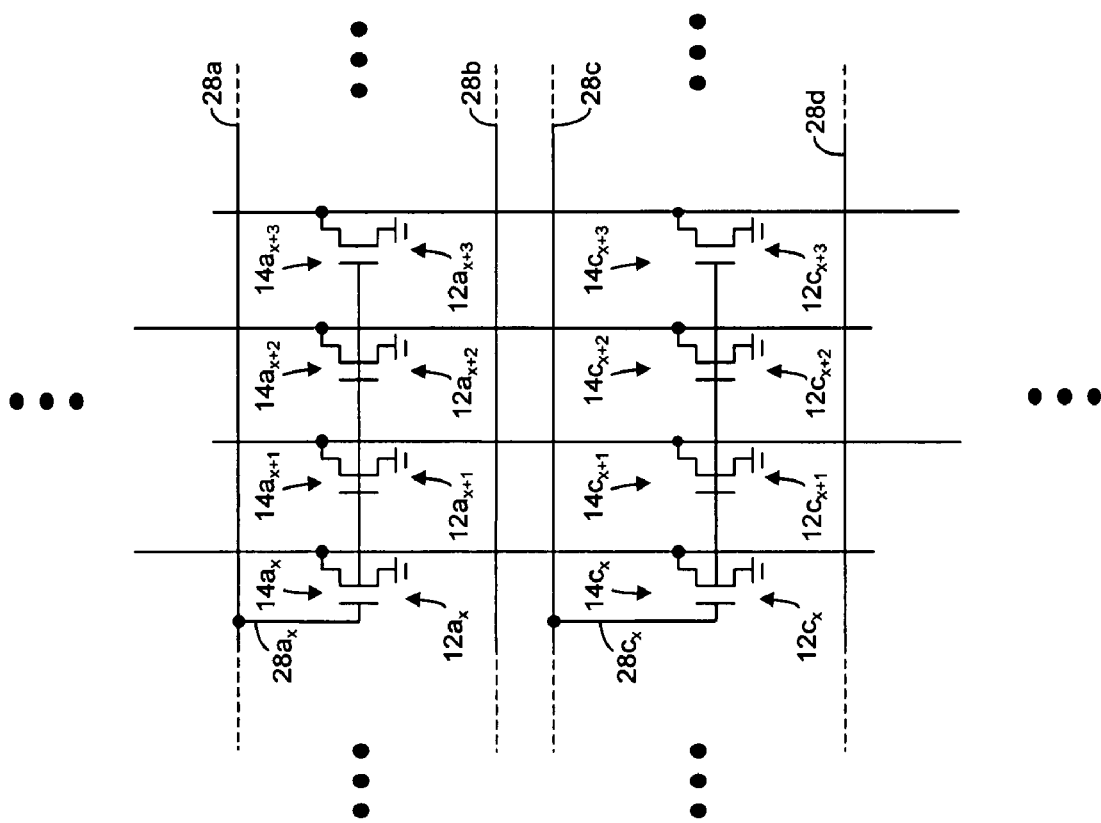
FIG. 7B is schematic block diagram illustration of a portion of a memory cell array which corresponds to the layout of FIG. 7A, according to certain aspects of the present inventions.

With reference to FIGS. 7A and 7B, in one embodiment, the present inventions may include memory cells 12 having electrically floating body transistor 14, as described above. In this exemplary layout, electrically floating body transistor 14 is an N-channel type transistor. In addition, the word line segments 28 interconnect and form the gates of adjacent transistors of adjacent memory cells. For example, word line segment $28a_x$ forms the gate of transistor $14a_x$ (of memory cell $12a_x$), the gate of transistor $14a_{x+1}$ (of memory cell $12a_{x+1}$), the gate of transistor $14a_{x+2}$ (of memory cell $12a_{x+2}$) and the gate of transistor $14a_{x+3}$ (of memory cell $12a_{x+3}$). Further, word line segment $28c_x$ forms the gate of transistor $14c_x$ (of memory cell $12c_x$), the gate of transistor $14c_{x+1}$ (of memory cell $12c_{x+1}$), the gate of transistor $14c_{x+2}$ (of memory cell $12c_x$) and the gate of transistor $14c_{x+3}$ (of memory cell $12c_{x+3}$). Notably, in a preferred embodiment, the configuration and/or layout of the memory cells 12 is proportional and/or equal to the pitch of the data sensing circuitry (for example, a data sense amplifier) in data sense/write circuitry 108. In one embodiment (referring again to FIG. 4B), this is provided by routing bit lines 32c and 32d "outside" the pitch of the data sensing circuitry to connect, for example, memory cells $12a_3$ and $12a_5$ to the data sensing circuitry of data sense/write circuitry 108c and 108a, respectively, and memory cells $12a_4$ and $12a_6$ to the data sensing circuitry of data sense/write circuitry 108d and 108b, respectively.

Figure 4B:
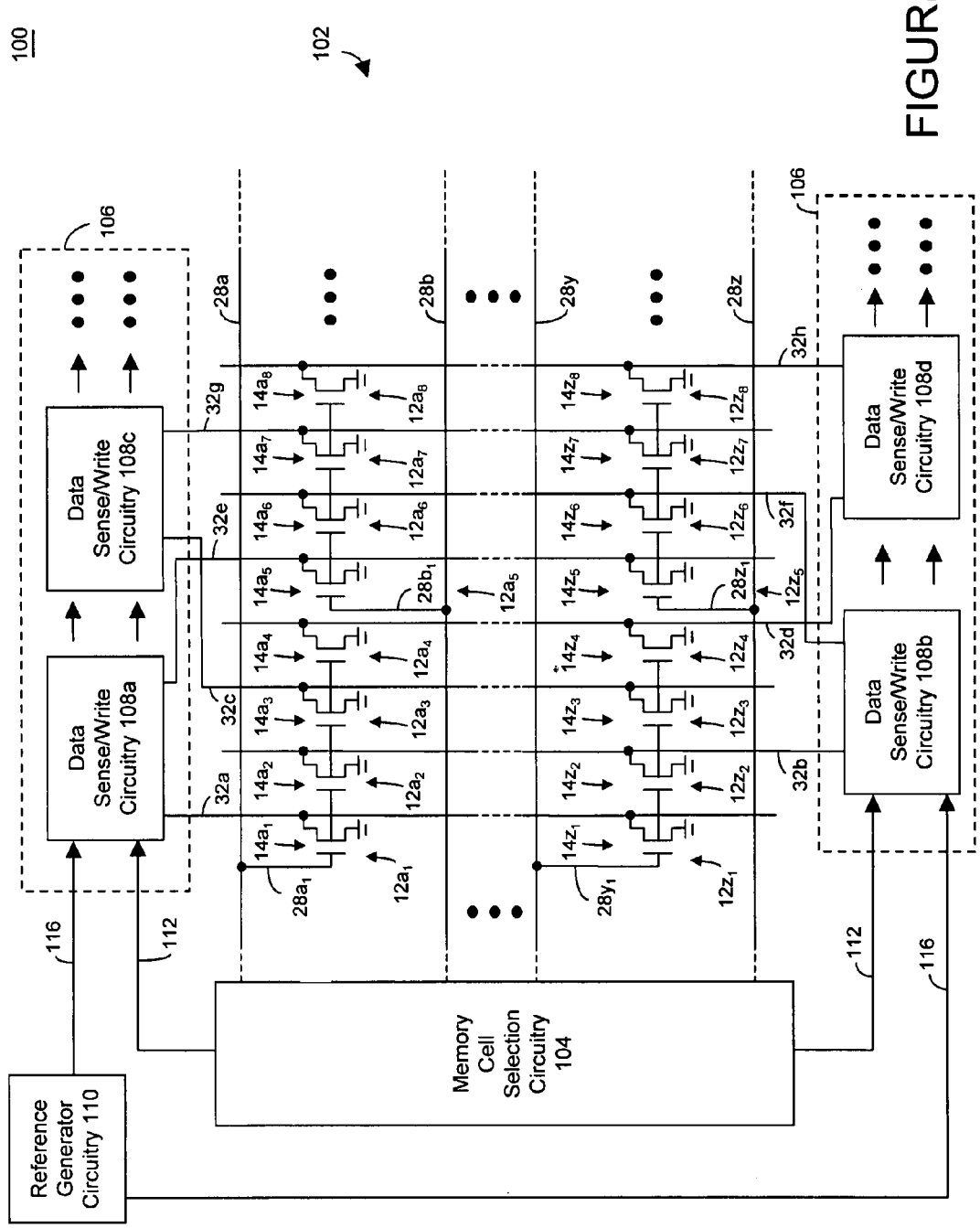

Notably, the memory architectures of FIGS. 4A and 4B include a layout whereby each data sense/write circuitry 108 is associated with two bit lines 32 and, as such, performs the appropriate operation (for example, read operation relative to the reference) with respect to memory cells 12 connected to the associated two bit lines. In this way, the number of data sense/write circuitry for a given memory array size is reduced. Accordingly, this configuration facilitates a more compact, lower power consumption architecture because fewer data sense/write circuitry 108 are employed relative to a given memory array size. Indeed, the configuration illustrated in FIG. 4B may be more dense than the configuration of FIG. 4A due to increased density of the memory array. In this regard, there are fewer "spaces" between and contacts to the word line segments. As such, transistors 14 of memory cells 12 may be located or placed closer.

Figure 8A:
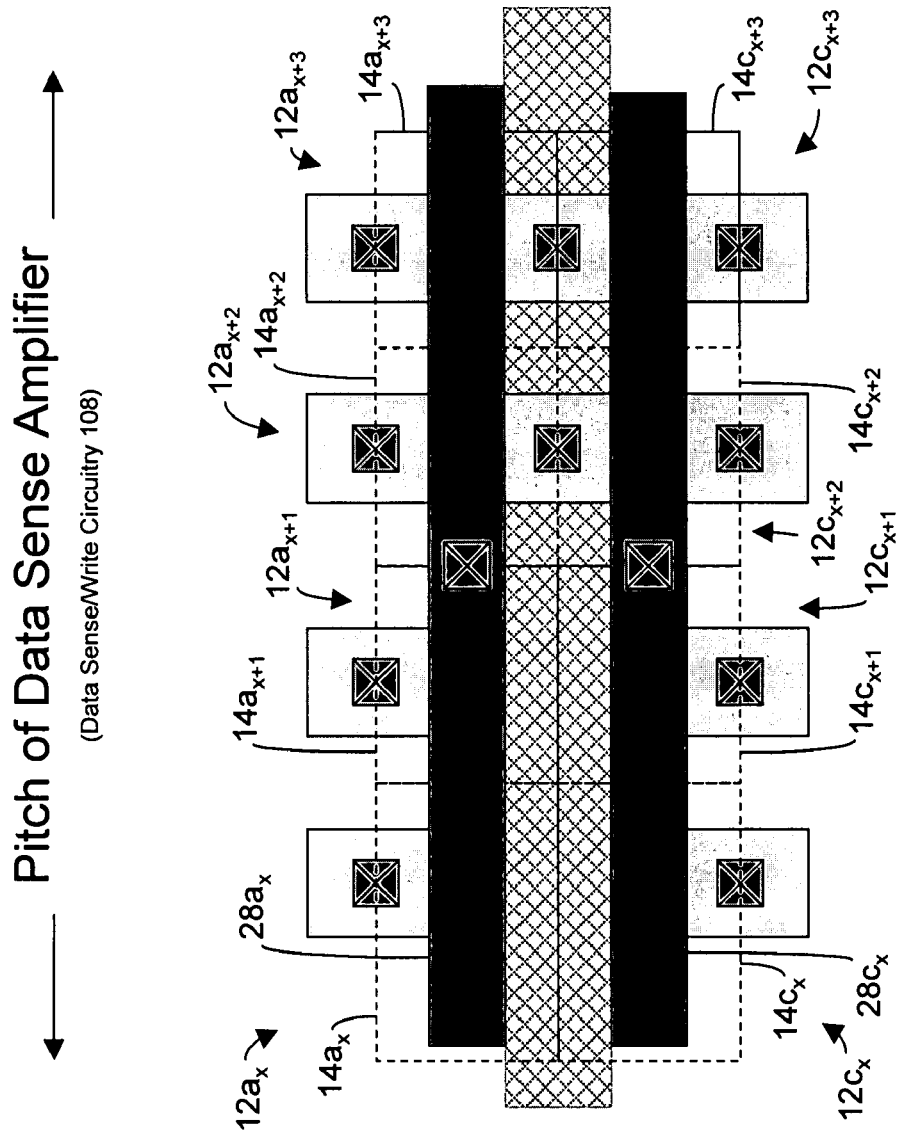
FIG. 8A is a plan view layout of a portion of the memory cell array illustrating word line segments of four memory cells which share a gate (for example, a gate comprised of a polysilicon material) with a central contact, according to certain aspects of the present inventions.
Figure 8B:
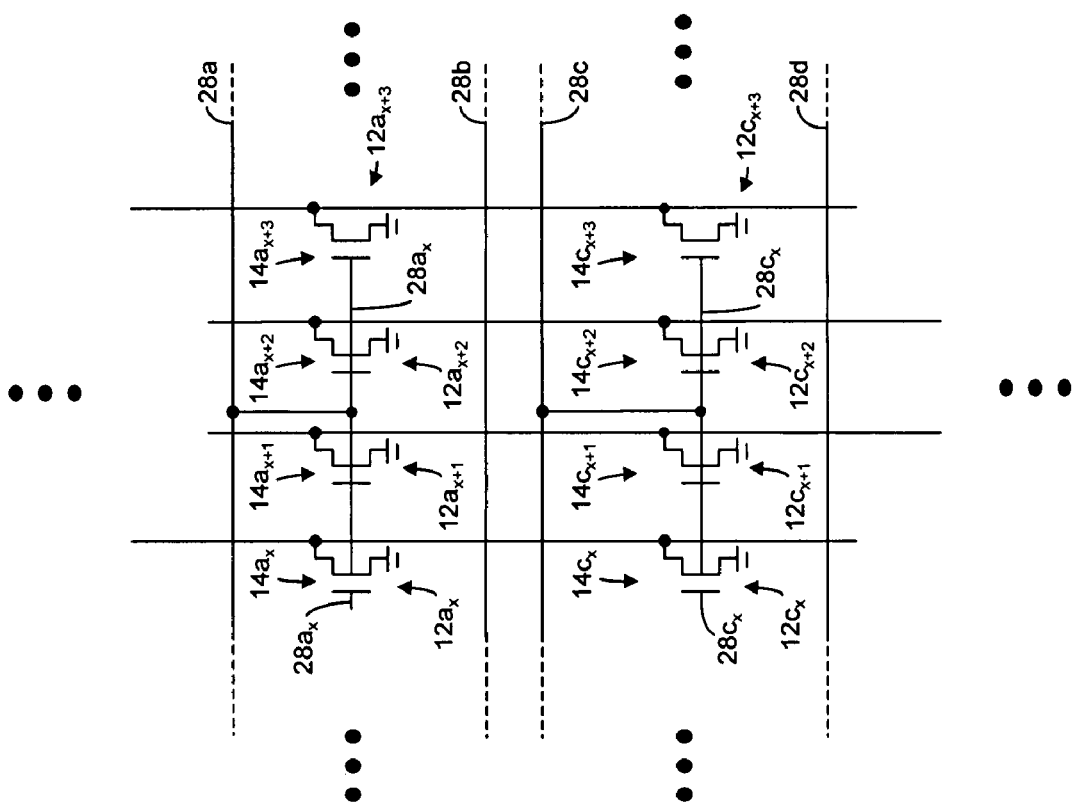
FIG. 8B is schematic block diagram illustration of a portion of a memory cell array which corresponds to the layout of FIG. 8A, according to certain aspects of the present inventions.

The layouts and circuit block diagrams of FIGS. 4A, 4B, 6A, 6B, 7A and 7B are merely exemplary. For example, with reference to FIGS. 8A and 8B, in this embodiment, the contacts to word line segments 28 are located in the "center" of the associated memory cells 12. (Compare FIGS. 7A and 7B). In addition, relative to the embodiment of FIGS. 7A and 7B, the bit line associated with memory cells $12a_x$ and $12c_x$ and the bit line associated with memory cells $12a_{x+3}$ and $12c_{x+3}$ may be routed to an associated data sensing circuitry of data sense/write circuitry 108. Moreover, the bit line associated with memory cells $12a_{x+1}$ and $12c_{x+1}$ and the bit line associated with memory cells $12a_{x+2}$ and $12c_{x+2}$ may be routed to an associated data sensing circuitry of data sense/write circuitry 108. Notably, all layouts and configurations are intended to fall within the scope of the present inventions.

The present inventions may be implemented in any electrically floating body memory cell and memory cell array. For example, in one aspect, the present inventions are directed to a memory array, having a plurality of memory cells each including an electrically floating body transistor, and/or technique of writing or programming data into one or more memory cells of such a memory array. In this aspect of the invention, the data states of adjacent memory cells and/or memory cells that share a word line may be individually programmed.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated herein)) may include N-channel type and/or P-channel type transistors. Where N-channel type transistors or P-channel type transistors are employed as memory cells 12 in the memory array(s), suitable write and read voltages (for example, negative voltages) are well known to those skilled in the art in light of this disclosure as well as applications incorporated by reference.

Figure 9A:
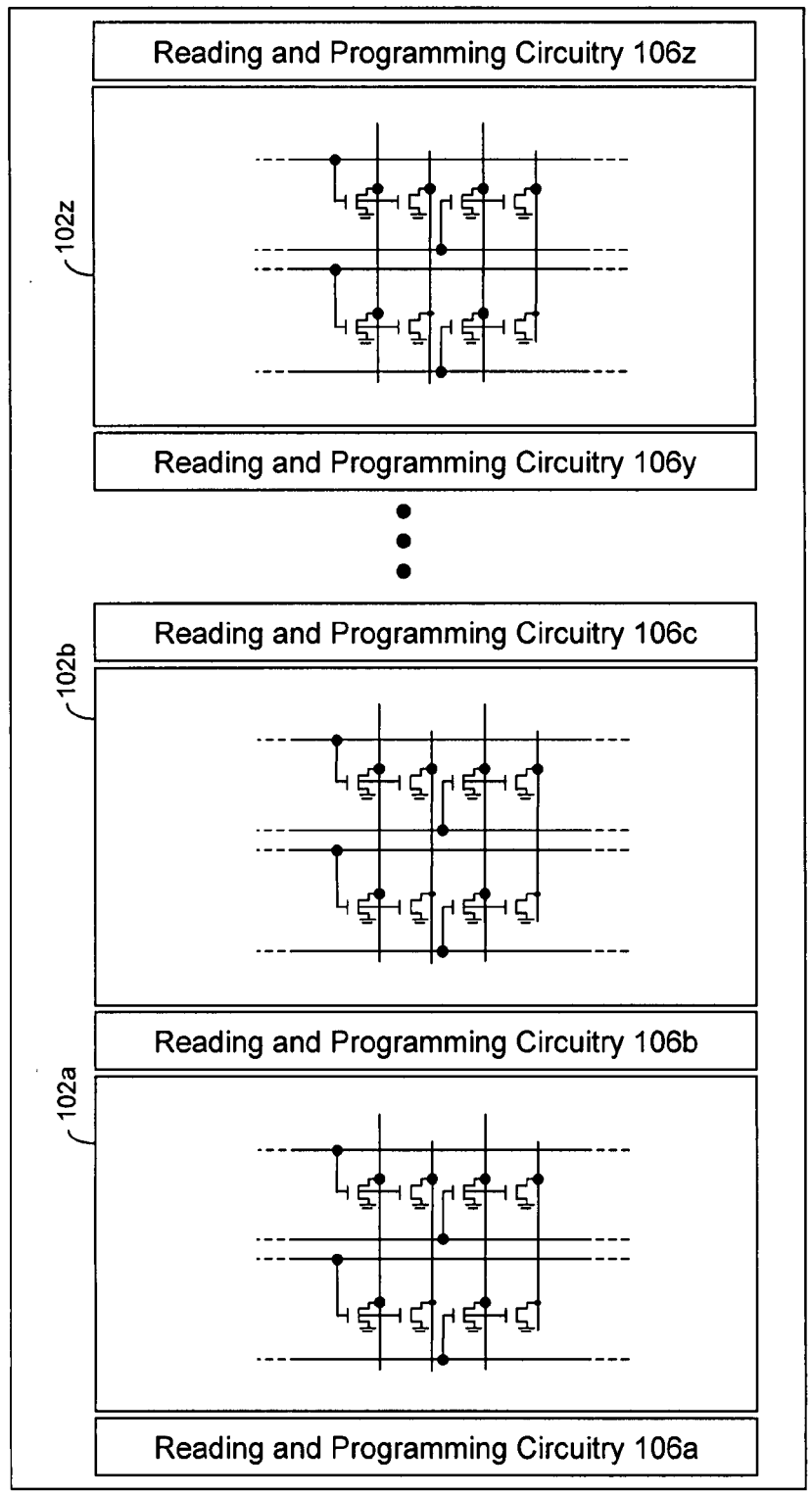
FIGS. 9A-9C are schematic representations of memory cell array(s), including a plurality of memory cells (for example, electrically body transistors or electrically floating gate transistors) in conjunction with data sense circuitry, according to various embodiments of the present inventions.
Figure 9B:
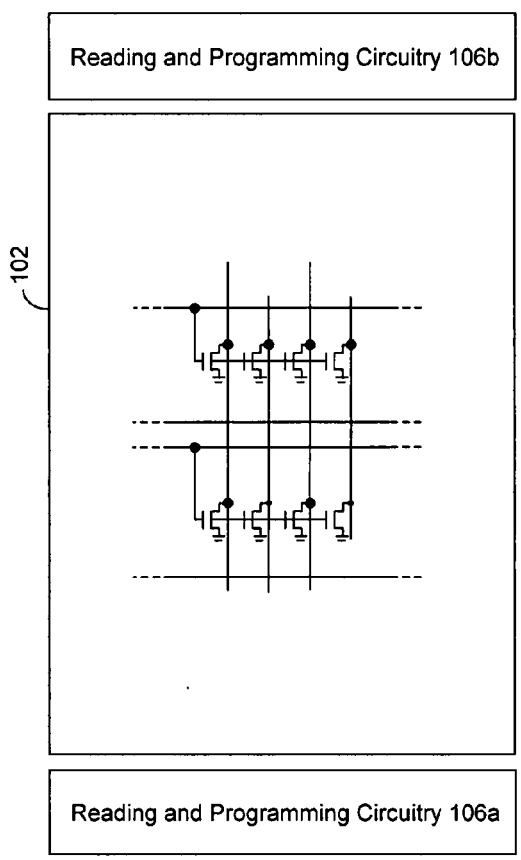
Figure 9C:
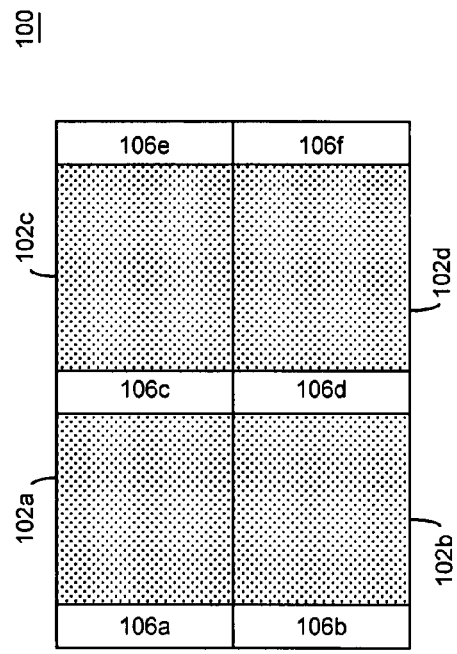

The present inventions may be implemented in any configuration and/or arrangement of memory cell array 102 and reading and programming circuitry 106. (See, for example, FIGS. 9A-9C). In this regard, integrated circuit device 100 (for example, memory or logic device) may include a plurality of memory cell arrays 102a-x, each having corresponding reading and programming circuitry 106a-x. Moreover, as illustrated in FIG. 9A, adjacent arrays 102a and 102b may share reading and programming circuitry 106b. Alternatively, with reference to FIG. 9B, integrated circuit device 100 may include memory array 102 which is connected to reading and programming circuitry 106a and 106b. In this embodiment, memory array 102 is embedded memory within an integrated circuit device 100 which includes extensive logic circuitry (not illustrated). Moreover, integrated circuit 100 may include a plurality of arrays 102a-102d, connected to reading and programming circuitry 106a-106f, respectively. The reading and programming circuitry 106a-106f may be located or disposed at the edges and in the center of the associated arrays 102a-102d, respectively. (See, for example, FIG. 9C). In this embodiment, memory arrays 102a-102d share reading and programming circuitry 106c and 106d.

Notably, in the exemplary embodiments, the pitch of the sensing/writing circuitry (for example, sense amplifier circuitry) in data sense/write circuitry 108 corresponds to, or substantially corresponds to, the pitch of "nx2" memory cells—wherein "n" is equal to the number of groups of word line segments for each row of cells. The exemplary embodiments use a value of two such that the pitch of the data sense/write circuitry 108 is four. The factor of 2 in the equation represents the fact that there are data sense/write circuits on two sides of the array. Further, this determines the pitch of the data sense/write circuitry such that a single bank of data sense/write circuitry can be placed on either side of the memory array. Such an architecture or configuration facilitates sharing of data sense/write circuitry 108 of reading and programming circuitry 106 by "adjacent" arrays (see, for example, FIG. 9A wherein memory arrays 102a and 102b share the sense/write circuitry of reading and programming circuitry 106b).

The present inventions may be employed or implemented in conjunction with one or more of the inventions, memory cells, memory arrays, and techniques for programming, reading, controlling and/or operating a memory cell and array of the following provisional U.S. patent applications:

(1) U.S. Non-Provisional patent application Ser. No. 11/304,387, which was filed by Okhonin et al. on Dec. 15, 2005 and entitled "Bipolar Reading Technique for a Memory Cell Having an Electrically Floating Body Transistor" (U.S. Patent Application Publication No. 2006/0131650);

(2) U.S. Non-Provisional patent application Ser. No. 11/453,594, which was filed by Okhonin et al. on Jun. 15, 2006 and entitled "Method for Reading a Memory Cell Having an Electrically Floating Body Transistor, and Memory Cell and Array Implementing Same" (U.S. Patent Application Publication No. 2007/0023833);

(3) U.S. Non-Provisional patent application Ser. No. 11/509,188, which was filed by Okhonin et al. on Aug. 24, 2006, and entitled "Memory Cell and Memory Cell Array Having an Electrically Floating Body Transistor, and Methods of Operating Same" (U.S. Patent Application Publication No. 2007/0058427);

(4) U.S. Non-Provisional patent application Ser. No. 11/633,311, which was filed by Okhonin on Dec. 4, 2006 and entitled "Electrically Floating Body Memory Cell and Array, and Method of Operating or Controlling Same"; and (5) U.S. Non-Provisional patent application Ser. No. 11/703,429, which was filed by Okhonin et al. on Feb. 7, 2007, and entitled "Multi-Bit Memory Cell Having Electrically Floating Body Transistor, and Method of Programming and Reading Same".

The entire contents of these five (5) U.S. patent applications, including, for example, the inventions, features, attributes, architectures, configurations, materials, techniques and advantages described and illustrated therein, are incorporated by reference herein. For the sake of brevity, those discussions will not be repeated; rather those discussions (text and illustrations), including the discussions relating to the memory cell, architecture, layout, structure, are incorporated by reference herein in its entirety.

In addition, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following provisional and non-provisional U.S. patent applications:

(1) U.S. Non-Provisional patent application Ser. No. 10/450,238, which was filed by Fazan et al. on Jun. 10, 2003 and entitled "Semiconductor Device" (now U.S. Pat. No. 6,969,662);

(2) U.S. Non-Provisional patent application Ser. No. 10/487,157, which was filed by Fazan et al. on Feb. 18, 2004 and entitled "Semiconductor Device" (now U.S. Pat. No. 7,061,050);

(3) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) U.S. Non-Provisional patent application Ser. No. 11/096,970, which was filed by Ferrant et al. and entitled "Semiconductor Memory Device and Method of Operating Same" (now U.S. Pat. No. 7,085,156);

(5) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298);

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions. Indeed, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Figure 10A:
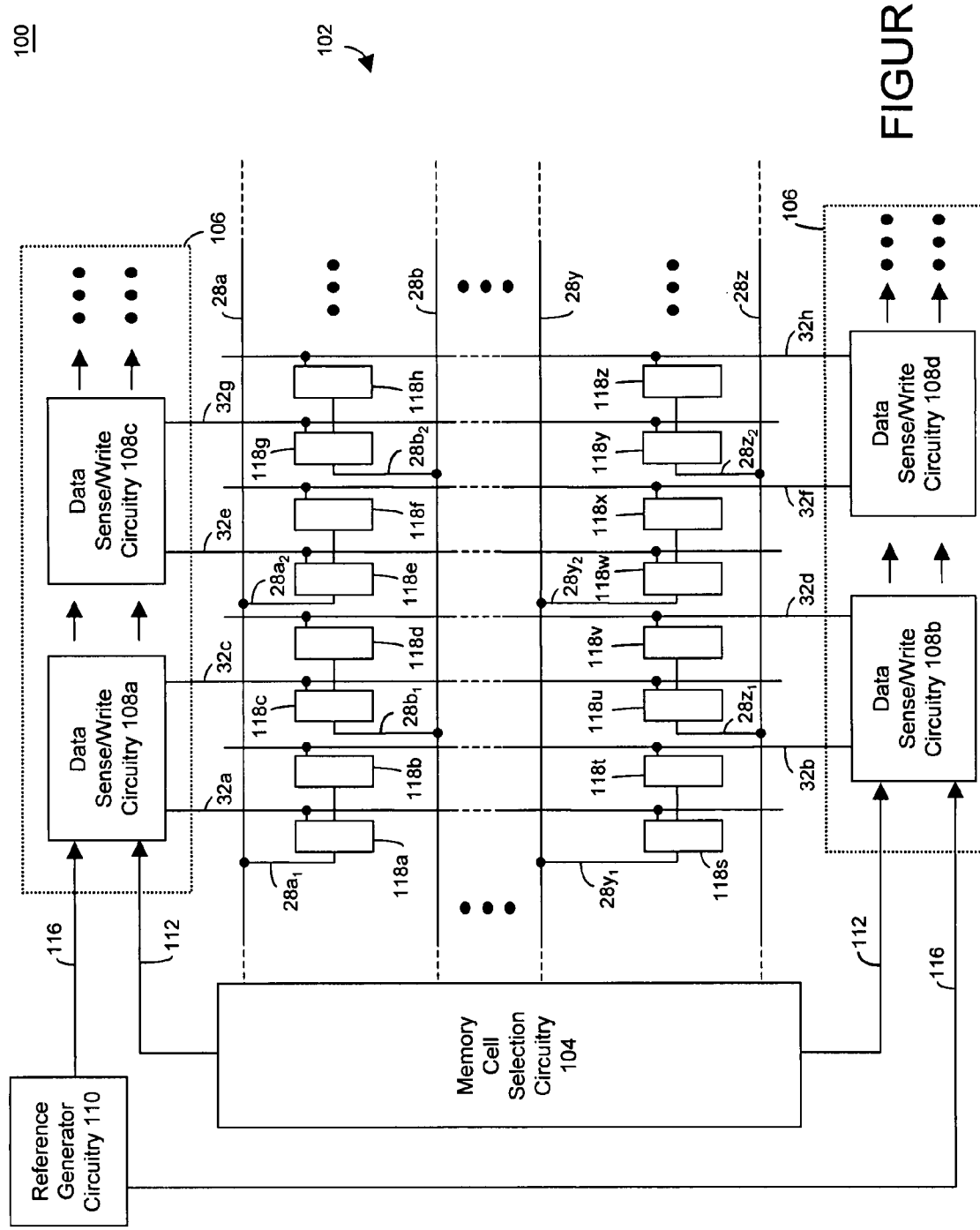
FIGS. 10A and 10B are schematic block diagram illustrations of two embodiments of the architecture of a portion of a memory cell array comprised of a plurality of memory cells, and associated data sense/write circuitry, in conjunction with certain peripheral circuitry (i.e., reference generator circuitry and memory cell selection circuitry), according certain aspects of the present inventions.
Figure 10B:
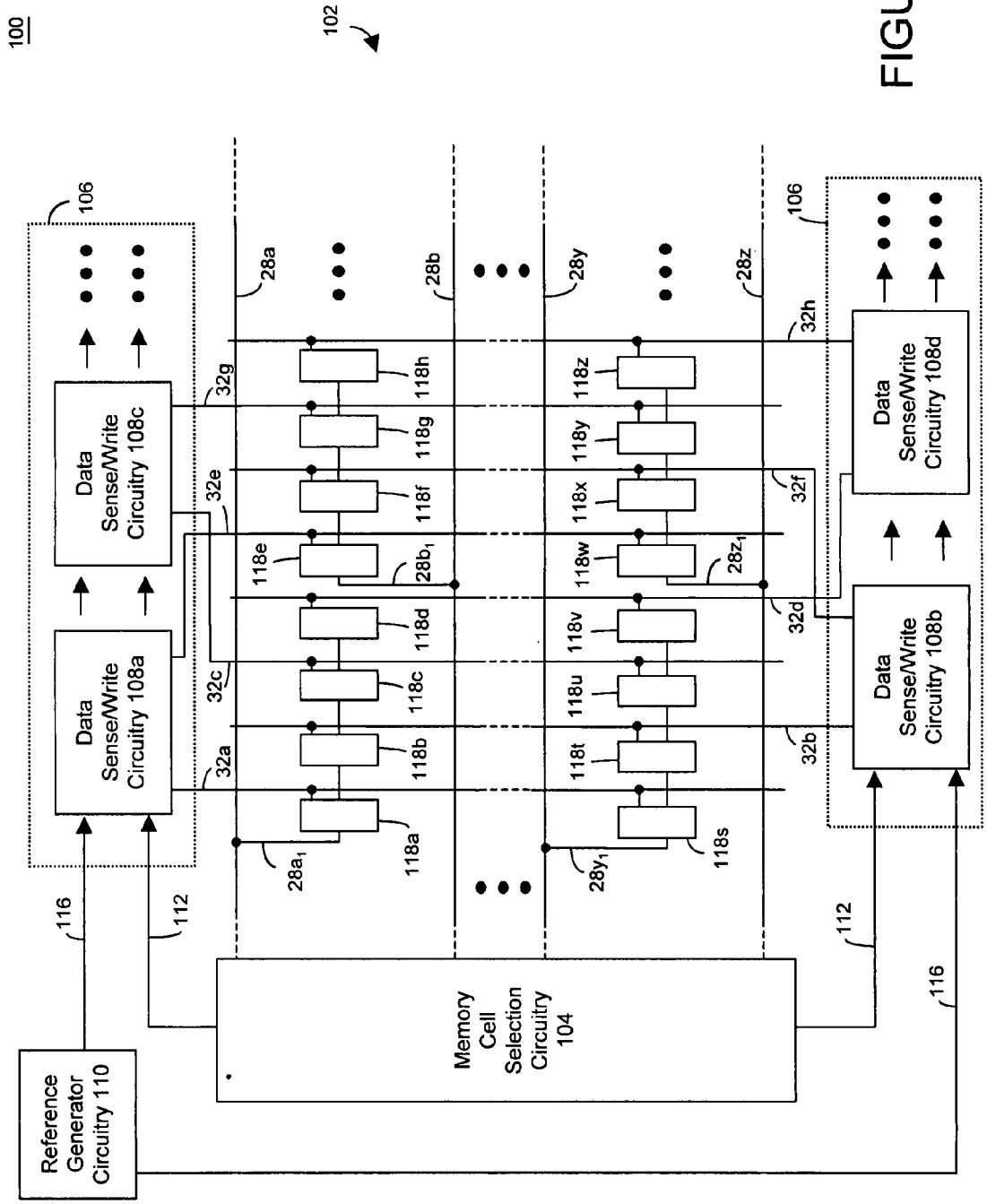

For example, with reference to FIGS. 10A and 10B, the present inventions may be implemented in conjunction with memory cells 118 which implement any memory cell technology that generates at least two current or voltage values (each current or voltage being representative of, for example, a respective data state) and employs a reference to discriminate such data states. For example, the memory cells 118 may be comprised of electrically floating gate transistors, junction field effect transistors (often referred to as JFETs), or any other memory/transistor technology whether now known (for example, one transistor one capacitor) or later developed. All such memory technologies are considered to fall within the scope of the present inventions.

It should be noted that memory cells 118 may be employed in any of the embodiments described and/or illustrated herein. Indeed, all permutations and combinations of the memory cells with such embodiments and/or features thereof, are intended to come within the scope of the present inventions. For the sake of brevity, such permutations and combinations are not discussed in detail herein.

Notably, where electrically floating body transistor 14 are employed, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel type transistor of the memory cell (whether the source and drain regions are interchangeable or not) is that region of the transistor that is connected to the bit line/sense amplifier.

As mentioned above, the inventions (and embodiments thereof described and illustrated herein are entirely applicable to N-channel and/or P-channel type transistors. Moreover, while the discussion described and illustrated only source and drain implants, other implants may also be included. For example, implants to modify the operation of memory cells 12, which affect, for example, the power consumption of memory cells 12 as described and illustrated in (1) U.S. Pat. No. 6,969,662 (identified above), (2) U.S. Pat. No. 7,061,050 (identified above), and (3) Provisional Application Ser. No. 60/578,631, which was filed on Jun. 10, 2004 and entitled "Asymmetrical Electrically Floating Body Memory Device, and Method of Manufacturing Same".

Further, as mentioned above, the memory arrays may be comprised of N-channel type transistors, P-channel type transistors and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Pat. No. 7,061,050). All such techniques, whether now known or later developed, are intended to fall within the scope of the present inventions.

Notably, memory cell selection circuitry 104 may employ any circuitry and/or technique now known or later developed to select one or more memory cells for reading and/or programming. Indeed, all such techniques and circuitry therefor, whether now known or later developed, are intended to fall within the scope of the present inventions.

Figure 11:
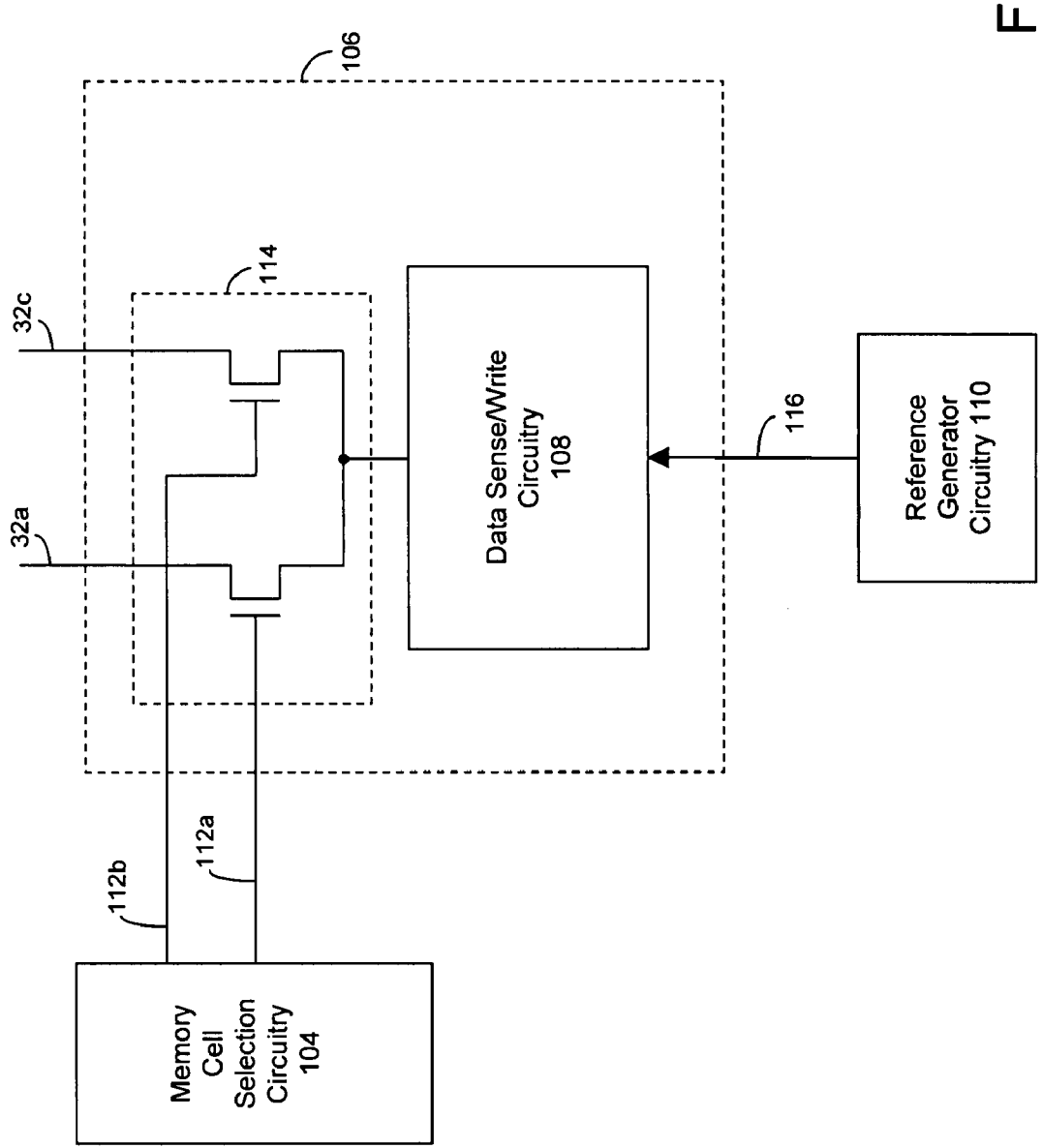
FIG. 11 is a schematic block diagram illustration of another exemplary embodiment of the bit line selection circuit, in conjunction with data sense/write circuitry, and certain peripheral circuitry (i.e., reference generator circuitry and memory cell selection circuitry), according to certain aspects of the present inventions.

Further, reading and programming circuitry 106 may employ any bit line selection circuit whether now known or later developed. For example, bit line selection circuit 114 may employ a CMOS pass gate configuration wherein each bit line is connected to an input of data sense/write circuitry 108 via a CMOS pass gate configuration. With reference to FIG. 11, in another embodiment, bit line selection circuit 114 may include N-channel type transistors which receive control signals (from memory selection circuitry 104) on signal lines 112a and 112b, respectively. Like the embodiment illustrated in FIG. 5, one of the two bit lines 32 (for example, bit lines 32a and 32c) is connected to the appropriate circuitry in data sense/write circuitry 108. Indeed, any bit line selection circuit whether now known or later developed is intended to fall within the scope of the present inventions.

Notably, the bit line selection circuit may eliminate, reduce and/or minimize bit line disturbance as well as reduce bit line capacitance from the perspective of data sense/write circuitry 108. Further, bit line selection circuit 114 may include "protection" circuitry or transistors in order to facilitate implementation of transistors having relatively thin gate oxides in bit line selection circuit 114 notwithstanding relatively high voltages applied on/to the bit lines during, for example, a write operation.

The reading and programming circuitry 106 may include output pass gates, latches and/or column switch circuitry to facilitate and/or implement read and write operations to memory cells 12. There are many different configurations and techniques (and circuitry therefor) to implement such circuitry. All such configurations and techniques, whether now known or later developed, are intended to fall within the scope of the present inventions.

Moreover, as mentioned above, data sense/write circuitry 108 may employ a sense amplifier to read the data stored in memory cells 12. The sense amplifier may sense the data state stored in memory cell 12 using voltage or current sensing techniques. In the context of a current sense amplifier (for example, Non-Provisional U.S. patent application Ser. No. 11/299,590 (U.S. Patent Application Publication US 2006/0126374), filed by Waller and Carman, on Dec. 12, 2005 and entitled "Sense Amplifier Circuitry and Architecture to Write Data into and/or Read Data from Memory Cells", the sense amplifier may compare the memory cell current to a reference current, for example, the current of a reference cell. From that comparison, the data state of memory cell 12 may be determined (for example, whether the memory cell 12 contained a logic high (relatively more majority carries 34 contained within body region 18) or logic low data state (relatively less majority carries 28 contained within body region 18)).

The reference current or voltage may be substantially equal to one-half of the summation of the currents in a first reference cell, which has a logic low data state, and a second reference cell, which has a logic high data state. Other reference current or voltage levels are suitable. Moreover, reference generator circuitry 110 is described in the context of generating, providing and/or supplying a reference current or voltage. The circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150), may be employed to generate an appropriate reference current for data sense/write circuitry 108. The entire contents of U.S. patent application Ser. No. 10/840,902, including, for example, the inventions, features, attributes, architectures, configurations, materials, techniques and advantages described and illustrated therein, are hereby incorporated by reference herein.

Figure 12:
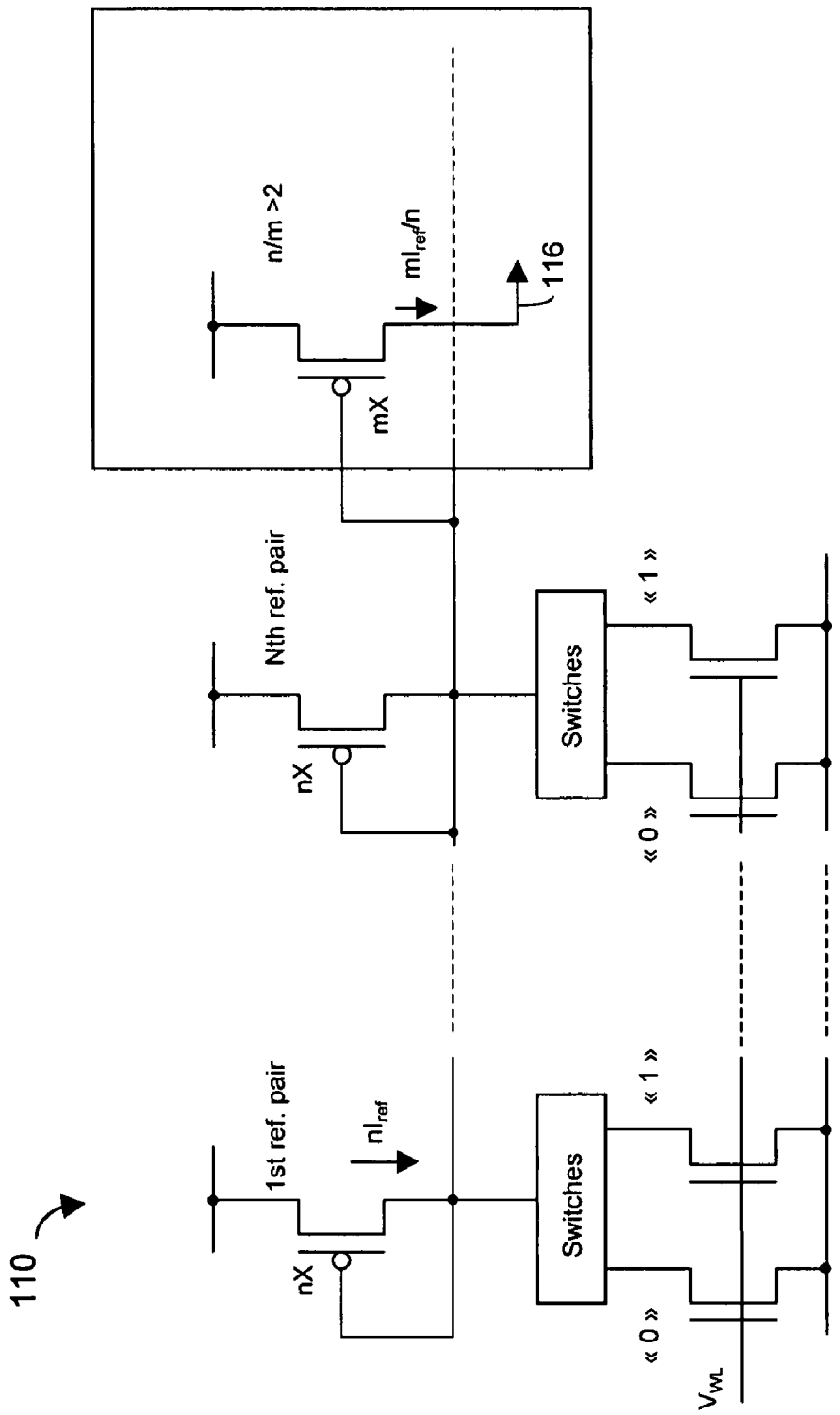
FIG. 12 is a schematic representation of one embodiment of one aspect of the circuitry and techniques for adjusting, setting, determining, controlling and/or generating a reference current, using a MOS transistor "ratioing" configuration, as described and illustrated in application Ser. No. 11/515,667 (U.S. Patent Application Publication US 2007/0064489), for one aspect of the data sense amplifier circuitry of the present inventions.
Figure 13:
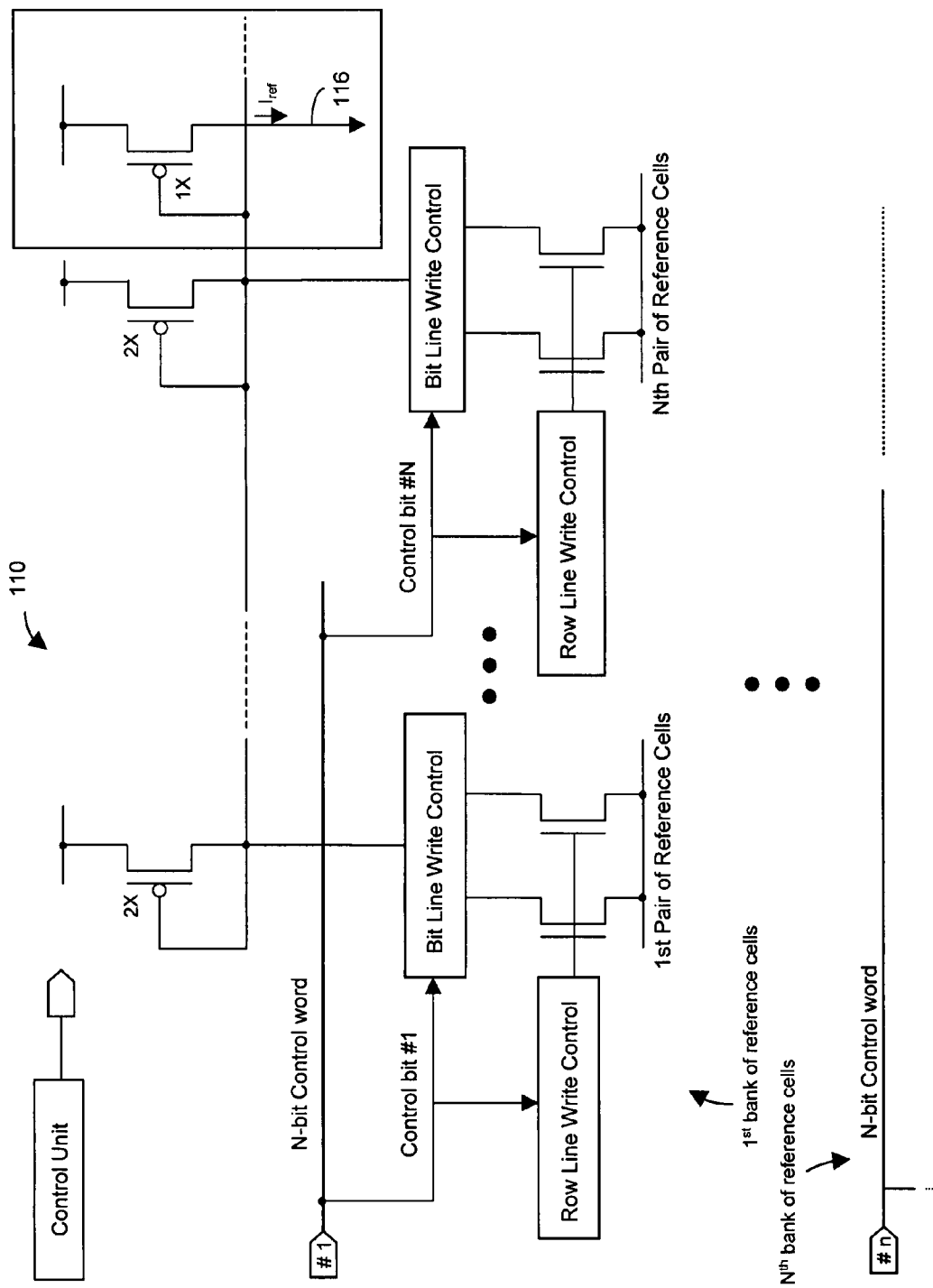
FIG. 13 is a schematic representation of one embodiment of one aspect of the circuitry and techniques for adjusting, setting, determining, controlling and/or generating a reference current, using the state of a control bit to a plurality of pair of reference cells in order to implement a digital control of the reference current level (employed during a read operation), as described and illustrated in application Ser. No. 11/515,667 (U.S. Patent Application Publication US 2007/0064489), for one aspect of the data sense amplifier circuitry of the present inventions.

In addition, the circuitry and techniques described and illustrated in U.S. patent application Ser. No. 11/515,667 (U.S. Patent Application Publication US 2007/0064489), which was filed by Bauser on Sep. 5, 2006, and entitled "Method and Circuitry to Generate a Reference Current for Reading a Memory Cell, and Device Implementing Same", may be employed to generate an appropriate reference current for data sense/write circuitry 108. (See, for example, FIGS. 12 and 13). The entire contents of U.S. patent application Ser. No. 11/515,667, including, for example, the inventions, features, attributes, architectures, configurations, materials, techniques and advantages described and illustrated therein, are hereby incorporated by reference herein. Notably, all such techniques and circuitry to generate an appropriate reference current for data sense/write circuitry 108, whether now known or later developed, are intended to fall within the scope of the present inventions.

Further, the present inventions may employ the circuitry and techniques for independently controlling certain parameters (for example, temporal or voltage), for a memory operation (for example, restore, write, refresh), to program or write a predetermined data state into a memory cell (for example, programming or writing data state "1" or "0" into a memory cell) as described and illustrated in U.S. patent application Ser. No. 11/590,147, which was filed by Popov et al. on Oct. 31, 2006, and entitled "Method and Apparatus for Varying the Programming Duration and/or Voltage of an Electrically Floating Body Transistor, and Memory Cell Array Implementing Same". For example, the duration of programming/writing/refreshing of a given memory state into a memory cell by data sense/write circuitry 108 may be controlled, adjusted, determined and/or predetermined according to or based on the given memory operation (for example, restore, write, refresh). Likewise, the voltage conditions applied to the memory cell for programming/writing a given memory state into a memory cell by data sense/write circuitry 108 may be controlled and/or adjusted according to the memory operation (for example, restore, write, refresh). The entire contents of U.S. patent application Ser. No. 11/590,147, including, for example, the inventions, features, attributes, architectures, configurations, materials, techniques and advantages described and illustrated therein, are hereby incorporated by reference herein.

The electrically floating memory cells, transistors and/or memory array(s) may be fabricated using well known techniques and/or materials. Indeed, any fabrication technique and/or material, whether now known or later developed, may be employed to fabricate the electrically floating body memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication US 2005/0017240) and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 102 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Figure 14A:
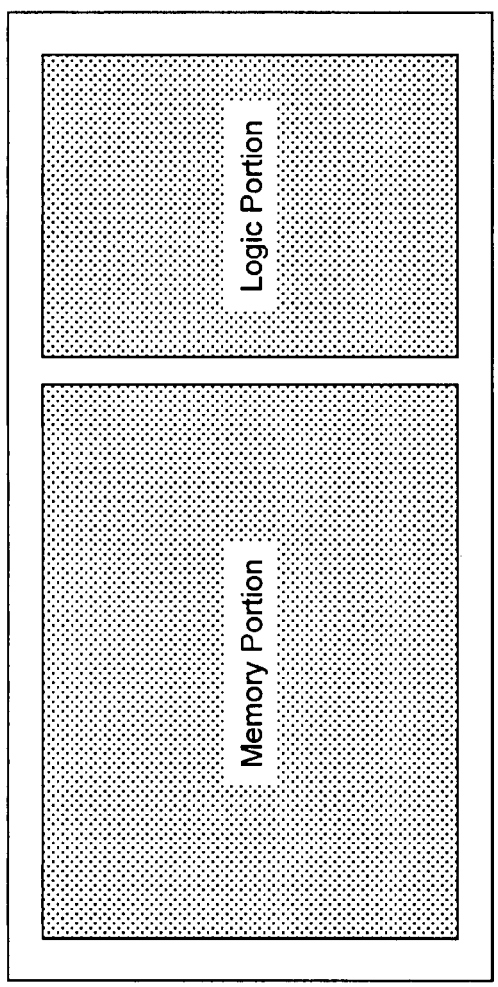
FIGS. 14A-14C are schematic block diagram illustrations of exemplary integrated circuit devices in which the memory cell array (and certain peripheral circuitry) may be implemented, according to one or more aspects of the present inventions.
Figure 14B:
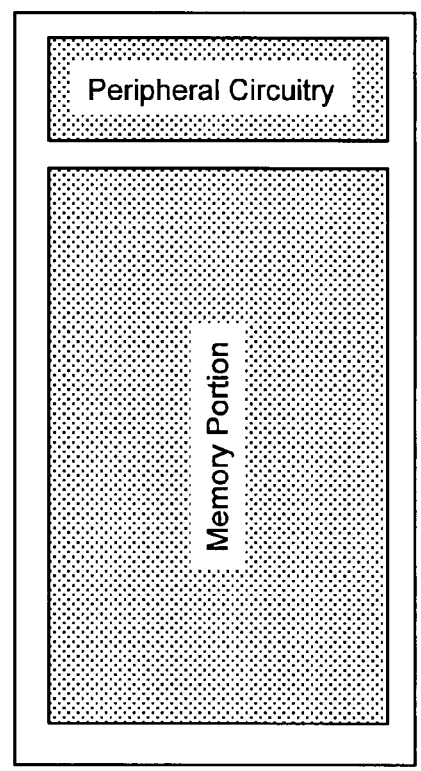
Figure 14C:
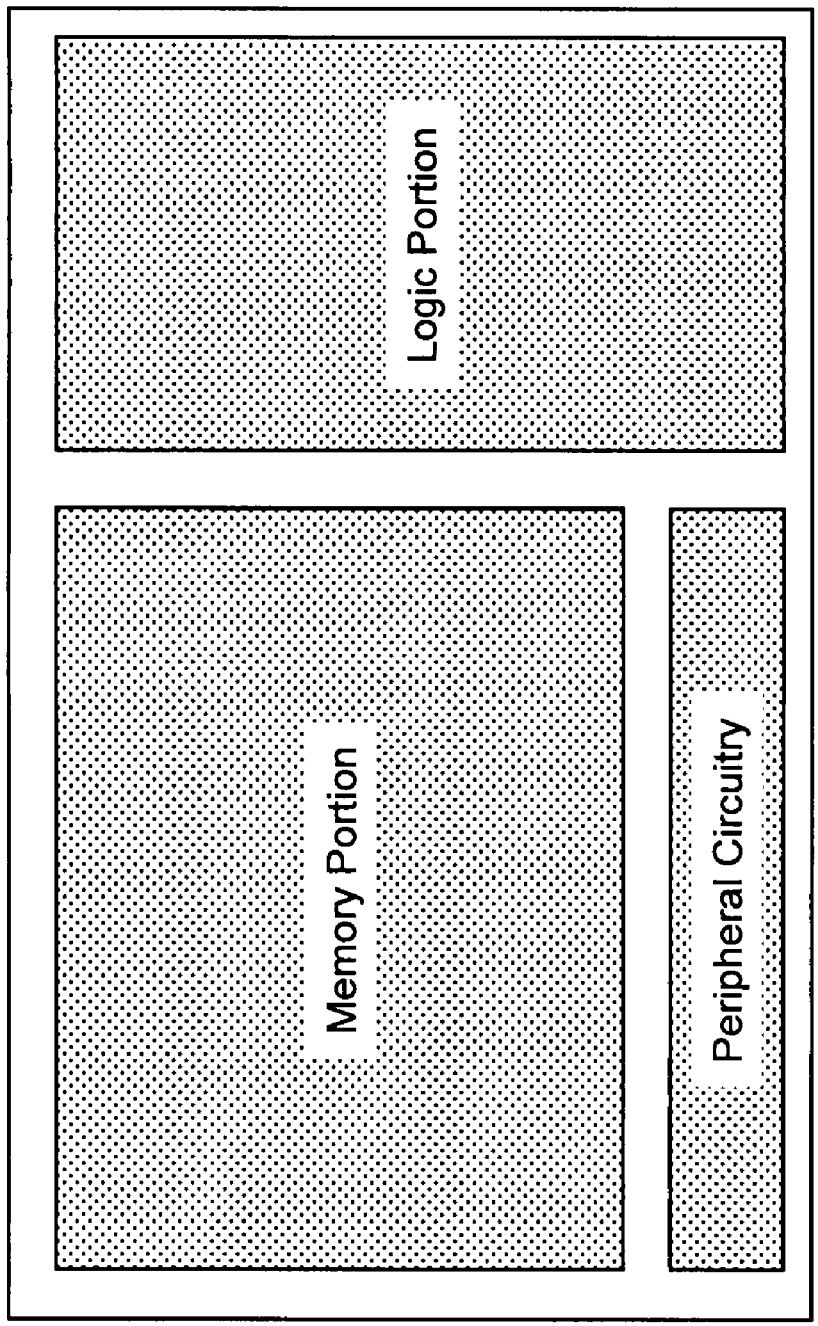

As noted above, the memory cell and/or memory cell array, as well as the circuitry of the present inventions may be implemented in an integrated circuit device having a memory portion and a logic portion (see, for example, FIGS. 14A and 14C), or an integrated circuit device that is primarily a memory device (see, for example, FIG. 14B). The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157 (U.S. Patent Application Publication No. 2004/0238890), which was filed by Fazan et al. on Feb. 18, 2004 and entitled "Semiconductor Device". All such techniques, whether now known or later developed, are intended to fall within the scope of the present inventions.

As noted above, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

The above embodiments of the invention are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the invention is not limited solely to the description above because the description of the above embodiments has been presented for the purposes of illustration and description.

It should be noted that the term "circuit" means, among other things, a single component or a multiplicity of components (whether in integrated circuit form or otherwise), which are active and/or passive, and which are coupled together to provide or perform a desired operation. The term "circuitry" means, among other things, a circuit (whether integrated or otherwise), or a group of circuits (whether integrated or otherwise). The term "to sense a/the data state stored in memory cell" means, among other things, to sample, to sense, to read and/or to determine a/the data state stored in memory cell; "sensing a/the data state stored in memory cell", "sensed a/the data state stored in memory cell" or the like shall have the same meaning.

What is claimed is:

1. An integrated circuit device comprising:
a memory cell array including:
a plurality of word lines including a first word line and a second word line;
a plurality of word line segments including a first word line segment and a second word line segment, wherein each word line segment is coupled to an associated word line and wherein the first word line segment is associated with the first word line and the second word line segment is associated with the second word line;
a plurality of bit lines; and
a plurality of memory cells, wherein each memory cell stores at least one data state and includes a transistor, wherein the transistor includes:
a first region coupled to an associated bit line;
a second region;
a body region disposed between the first region and the second region, wherein the body region is electrically floating; and
a gate coupled to an associated word line via an associated word line segment; and
wherein:
a first group of memory cells is coupled to the first word line via the first word line segment and a second group of memory cells is coupled to the second word line via the second word line segment; and
at least one memory cell of the first group of memory cells is adjacent to at least one memory cell of the second group of memory cells;
first circuitry, coupled to (i) a first memory cell in the first group of memory cells and (ii) a first memory cell in the second group of memory cells, to sense a data state stored in the first memory cell and a data state stored in the second memory cell wherein the first memory cell in the second group of memory cells is adjacent to one of the memory cells in the first group of memory cells; and
reference generator circuitry, coupled to the first circuitry, to provide a reference to the first circuitry wherein the first circuitry uses the reference to sense the data state stored in each memory cell coupled to the first and second bit lines.

2. The integrated circuit device of claim 1 wherein the number of memory cells in the first group of memory cells is two.

3. The integrated circuit device of claim 1 wherein the number of memory cells in the first group of memory cells is two or more.

4. The integrated circuit device of claim 1 wherein the number of memory cells in the first group of memory cells is substantially equal to a pitch of the first circuitry.

5. The integrated circuit device of claim 1 further including second circuitry, coupled to (i) a second memory cell in the first group of memory cells and (ii) a second memory cell in the second group of memory cells, wherein the first circuitry is located on a first side of the first and second groups of memory cells and the second circuitry is located on a second side of the first and second groups of memory cells, wherein the first side is opposite the second side.

6. The integrated circuit device of claim 1 further including bit line selection circuitry disposed between (i) the first circuitry and (ii) the first and second bit lines, to connect the first bit line to the first circuitry in response to a first signal and the second bit line to the first circuitry in response to a second signal.

7. An integrated circuit device comprising:
   a memory cell array including:
      a plurality of word lines including a first word line and a second word line;
      a plurality of word line segments including a first word line segment and a second word line segment, wherein each word line segment is coupled to an associated word line and wherein the first word line segment is associated with the first word line and the second word line segment is associated with the second word line;
      a plurality of bit lines; and
      a plurality of memory cells, wherein each memory cell stores at least one data state and includes a transistor, wherein the transistor includes:
         a first region coupled to an associated bit line;
         a second region;
         a body region disposed between the first region and the second region, wherein the body region is electrically floating; and
         a gate coupled to an associated word line via an associated word line segment; and
      wherein:
         a first group of memory cells is coupled to the first word line via the first word line segment and a second group of memory cells is coupled to the second word line via the second word line segment; and
         at least one memory cell of the first group of memory cells is adjacent to at least one memory cell of the second group of memory cells;
   first circuitry, coupled to a first bit line and a second bit line, to sense a data state stored in each memory cell coupled to the first and second bit lines, wherein:
      the first region of the transistor of the first memory cell in the first group of memory cells is coupled to the first circuitry via the first bit line; and
      the first region of the transistor of the first memory cell in the second group of memory cells is coupled to the first circuitry via the second bit line; and
   bit line selection circuitry to responsively connect the first bit line or second bit line to the first circuitry.

8. The integrated circuit device of claim 7 further including reference generator circuitry, coupled to the first circuitry, to provide a reference to the first circuitry wherein the first circuitry uses the reference to sense the data state stored in each memory cell coupled to the first and second bit lines.

9. The integrated circuit device of claim 7 wherein the number of memory cells in the first group of memory cells is two or more.

10. The integrated circuit device of claim 7 wherein the number of memory cells in the first group of memory cells is substantially equal to a pitch of the first circuitry.

11. The integrated circuit device of claim 7 further including second circuitry, coupled to (i) a second memory cell in the first group of memory cells and (ii) a second memory cell in the second group of memory cells, wherein the first circuitry is located on a first side of the first and second groups of memory cells and the second circuitry is located on a second side of the first and second groups of memory cells, wherein the first side is opposite the second side.

12. An integrated circuit device comprising:
   a memory cell array including:
      a plurality of word lines including a first word line and a second word line;
      a plurality of word line segments including a first word line segment and a second word line segment, wherein each word line segment is coupled to an associated word line and wherein the first word line segment is associated with the first word line and the second word line segment is associated with the second word line;
      a plurality of bit lines; and
      a plurality of memory cells, wherein each memory cell stores at least one data state and includes a transistor, wherein the transistor includes:
         a first region coupled to an associated bit line;
         a second region;
         a body region disposed between the first region and the second region, wherein the body region is electrically floating; and
         a gate coupled to an associated word line via an associated word line segment; and
      wherein:
         a first group of memory cells is coupled to the first word line via the first word line segment and a second group of memory cells is coupled to the second word line via the second word line segment; and
         at least one memory cell of the first group of memory cells is adjacent to at least one memory cell of the second group of memory cells; and
   first circuitry, coupled to a first memory cell in the first group of memory cells, to sense the data state stored in a first memory cell;
   wherein the number of memory cells in the first group of memory cells is substantially equal to a pitch of the first or second circuitry.

13. The integrated circuit device of claim 12 further including reference generator circuitry, coupled to the first circuitry, to provide a reference to the first circuitry wherein the first circuitry uses the reference to sense the data state stored in each memory cell coupled to the first and second bit lines.

14. The integrated circuit device of claim 12 wherein the number of memory cells in the first group of memory cells is two or more.

15. An integrated circuit device comprising:
   a memory cell array including:
      a plurality of word lines including a first word line and a second word line;
      a plurality of word line segments including a first word line segment and a second word line segment, wherein each word line segment is coupled to an associated word line and wherein the first word line segment is associated with the first word line and the second word line segment is associated with the second word line;
      a plurality of bit lines; and
      a plurality of memory cells, each memory cell includes a transistor, wherein the transistor includes:
         a first region coupled to an associated bit line;
         a second region;
         a body region disposed between the first region and the second region, wherein the body region is electrically floating; and
         a gate coupled to an associated word line via an associated word line segment; and wherein each memory cell stores at least one data state including:
- (i) a first data state which is representative of a first charge in the body region of the associated electrically floating body transistor; and
- (ii) a second data state which is representative of a second charge in the body region of the associated electrically floating body transistor; and wherein:
- a first group of memory cells is coupled to the first word line via the first word line segment and a second group of memory cells is coupled to the second word line via the second word line segment; and
- at least one memory cell of the first group of memory cells is adjacent to at least one memory cell of the second group of memory cells.

16. The integrated circuit device of claim 15 wherein the number of memory cells in the first group of memory cells is two or more.

17. The integrated circuit device of claim 15 further including:
first circuitry, coupled to a first memory cell in the first group of memory cells, to sense the data state stored in a first memory cell;
second circuitry, coupled to a second memory cell in the first group of memory cells, to sense the data state stored in a second memory cell;
wherein the number of memory cells in the first group of memory cells is substantially equal to a pitch of the first or second circuitry.

18. The integrated circuit device of claim 15 further including:
first circuitry, coupled to a first memory cell in the first group of memory cells, to sense the data state stored in a first memory cell;
second circuitry, coupled to a second memory cell in the first group of memory cells, to sense the data state stored in a second memory cell;
wherein:
the first circuitry is coupled to a first memory cell in the second group of memory cells, to sense the data state stored in a first memory cell in the second group of memory cells;
the second circuitry is coupled to a second memory cell in the second group of memory cells, to sense the data state stored in a second memory cell in the second group of memory cells; and
the first circuitry is located on a first side of the first and second groups of memory cells and the second circuitry is located on a second side of the first and second groups of memory cells, wherein the first side is opposite the second side.

19. The integrated circuit device of claim 15 further including first circuitry, coupled to (i) a first memory cell in the first group of memory cells and (ii) a first memory cell in the second group of memory cells, to sense the data state stored in the first memory cell and the second memory cell wherein the first memory cell in the second group of memory cells is adjacent to one of the memory cells in the first group of memory cells.

20. The integrated circuit device of claim 15 further including:
first circuitry, coupled to a first bit line and a second bit line, to sense the data state stored in each memory cell connected to the first and second bit lines, wherein:
the first region of the transistor of the first memory cell in the first group of memory cells is coupled to the first circuitry via the first bit line; and
the first region of the transistor of the first memory cell in the second group of memory cob is coupled to the first circuitry via the second bit line; and
bit line selection circuitry to responsively connect the first bit line or second bit line to the first circuitry.

21. The integrated circuit device of claim 15 further including:
first circuitry, coupled to a first bit line and a second bit line, to sense the data state stored in each memory cell connected to the first and second bit lines, wherein:
the first region of the transistor of the first memory cell in the first group of memory cells is coupled to the first circuitry via the first bit line; and
the first region of the transistor of the first memory cell in the second group of memory cells is coupled to the first circuitry via the second bit line; and
bit line selection circuitry disposed between (i) the first circuitry and (ii) the first and second bit lines, to connect the first bit line to the first circuitry in response to a first signal and the second bit line to the first circuitry in response to a second signal.

22. An integrated circuit device comprising:
a memory cell any including:
a plurality of word lines including a first word line and a second word line;
a plurality of word line segments including a first word line segment and a second word line segment, wherein each word line segment is coupled to an associated word line and wherein the first word line segment is associated with the first word line and the second word line segment is associated with the second word line;
a plurality of bit lines; and
a plurality of memory cells, each memory cell storing at least one memory state and consisting essentially of a transistor, wherein the transistor includes:
a first region coupled to an associated bit line;
a second region;
a body region disposed between the first region and the second region, wherein the body region is electrically floating; and
a gate coupled to an associated word line via an associated word line segment; and
wherein:
a first group of memory cells is coupled to the first word line via the first word line segment and a second group of memory cells is coupled to the second word line via the second word line segment; and
at least one memory cell of the first group of memory cells is adjacent to at least one memory cell of the second group of memory cells.

23. The integrated circuit device of claim 22 further including:
first circuitry, coupled to a first memory cell in the first group of memory cells, to sense the data state stored in a first memory cell;
wherein the number of memory cells in the first group of memory cells is substantially equal to a pitch of the first circuitry.

24. The integrated circuit device of claim 22 further including:
first circuitry, coupled to a first memory cell in the first group of memory cells, to sense the data state stored in a first memory cell;

second circuitry, coupled to a second memory cell in the first group of memory cells, to sense the data state stored in a second memory cell; and wherein:

the first circuitry is coupled to a first memory cell in the second group of memory cells, to sense the data state stored in a first memory cell in the second group of memory cells;

the second circuitry is coupled to a second memory cell in the second group of memory cells, to sense the data state stored in a second memory cell in the second group of memory cells; and the first circuitry is located on a first side of the first and second groups of memory cells and the second circuitry is located on a second side of the first and second groups of memory cells, wherein the first side is opposite the second side.

25. The integrated circuit device of claim 22 further including first circuitry, coupled to (i) a first memory cell in the first group of memory cells and (ii) a first memory cell in the second group of memory cells, to sense the data state stored in the first memory cell and the second memory cell wherein the first memory cell in the second group of memory cells is adjacent to one of the memory cells in the first group of memory cells.

26. The integrated circuit device of claim 25 further including reference generator circuitry, coupled to the first circuitry, to provide a reference to the first circuitry wherein the first circuitry uses the reference to sense the data state stored in each memory cell coupled to the first and second bit lines.

27. The integrated circuit device of claim 22 further including:

first circuitry, coupled to a first bit line and a second bit line, to sense the data state stored in each memory cell connected to the first and second bit lines, wherein:

the first region of the transistor of the first memory cell in the first group of memory cells is coupled to the first circuitry via the first bit line; and the first region of the transistor of the first memory cell in the second group of memory cells is coupled to the first circuitry via the second bit line; and bit line selection circuitry disposed between (i) the first circuitry and (ii) the first and second bit lines, to connect the first bit line to the first circuitry in response to a first signal and the second bit line to the first circuitry in response to a second signal.

28. The integrated circuit device of claim 27 further including reference generator circuitry, coupled to the first circuitry, to provide a reference to the first circuitry wherein the first circuitry uses the reference to sense the data state stored in each memory cell coupled to the first and second bit lines.

* * * * *